United States Patent
Ebiko

(10) Patent No.: US 12,034,024 B2
(45) Date of Patent: Jul. 9, 2024

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventor: Yoshiki Ebiko, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 635 days.

(21) Appl. No.: 17/265,264

(22) PCT Filed: Jul. 12, 2019

(86) PCT No.: PCT/JP2019/027627
§ 371 (c)(1),
(2) Date: Feb. 2, 2021

(87) PCT Pub. No.: WO2020/036025
PCT Pub. Date: Feb. 20, 2020

(65) Prior Publication Data
US 2021/0313361 A1     Oct. 7, 2021

(30) Foreign Application Priority Data
Aug. 13, 2018   (JP) ................. 2018-152290

(51) Int. Cl.
H01L 27/146    (2006.01)
G02B 5/20      (2006.01)

(52) U.S. Cl.
CPC .......... H01L 27/1463 (2013.01); G02B 5/201 (2013.01); G02B 5/208 (2013.01);
(Continued)

(58) Field of Classification Search
CPC ..................... H01L 27/1463; H01L 27/14
See application file for complete search history.

(56) References Cited

U.S. PATENT DOCUMENTS

2007/0272836 A1    11/2007    Higashitsutsumi et al.
2014/0054662 A1    2/2014     Yanagita et al.
(Continued)

FOREIGN PATENT DOCUMENTS

CN    107112332 A    8/2017
CN    108292665 A    7/2018
(Continued)

OTHER PUBLICATIONS

International Search Report prepared by the Japan Patent Office on Sep. 13, 2019, for International Application No. PCT/JP2019/027627.

*Primary Examiner* — Yu-Hsi D Sun
(74) *Attorney, Agent, or Firm* — Sheridan Ross PC

(57) ABSTRACT

There is provided a solid-state imaging device that is capable of suppression of color mixing caused by a pixel for near-infrared light and securement of a saturation charge amount of a pixel for visible light where the pixels are formed in a same substrate. The solid-state imaging device includes: a substrate; first to third photoelectric conversion units; infrared absorbing filters; first to third color filters; a first element isolation unit between the first and second photoelectric conversion units; and a second element isolation unit disposed between the second and third photoelectric conversion units, in which a cross-sectional area of the first element isolation unit along a direction in which the first and second photoelectric conversion units are aligned is larger than a cross-sectional area of the second element isolation unit along a direction in which the second and third photoelectric conversion units are aligned.

12 Claims, 16 Drawing Sheets

(52) U.S. Cl.
CPC .. *H01L 27/14607* (2013.01); *H01L 27/14621* (2013.01); *H01L 27/14623* (2013.01); *H01L 27/14627* (2013.01); *H01L 27/1464* (2013.01); *H01L 27/14645* (2013.01); *H01L 27/14649* (2013.01)

(56) References Cited

U.S. PATENT DOCUMENTS

| | | | |
|---|---|---|---|
| 2017/0317131 A1* | 11/2017 | Shimada | H01L 27/14 |
| 2017/0317132 A1 | 11/2017 | Hatakeyama et al. | |
| 2018/0359434 A1 | 12/2018 | Tanaka et al. | |
| 2019/0006406 A1 | 1/2019 | Ozawa et al. | |
| 2023/0215901 A1* | 7/2023 | Yamashita | H04N 25/77 |
| | | | 257/292 |

FOREIGN PATENT DOCUMENTS

| | | |
|---|---|---|
| JP | 2007-311447 | 11/2007 |
| JP | 2013-175494 | 9/2013 |
| JP | 2017-108062 | 6/2017 |
| JP | 2017-139286 | 6/2017 |
| KR | 20140015326 A | 2/2014 |
| KR | 20150037897 A | 4/2015 |
| WO | WO 2016/117596 | 7/2016 |
| WO | WO-2017134864 A1 | 8/2017 |
| WO | WO 2017/154444 | 9/2017 |

* cited by examiner

SOLID-STATE IMAGING DEVICE AND ELECTRONIC APPARATUS

CROSS REFERENCE TO RELATED APPLICATIONS

This application is a national stage application under 35 U.S.C. 371 and claims the benefit of PCT Application No. PCT/JP2019/027627 having an international filing date of 12 Jul. 2019, which designated the United States, which PCT application claimed the benefit of Japanese Patent Application No. 2018-152290, filed 13 Aug. 2018, the entire disclosures of each of which are incorporated herein by reference.

TECHNICAL FIELD

The technology according to the present disclosure (the present technology) relates to a solid-state imaging device and an electronic apparatus.

BACKGROUND ART

Conventionally, there has been known a solid-state imaging device capable of simultaneously acquiring a color image and a near-infrared image (see Patent Literature 1). In Patent Literature 1, a photoelectric conversion unit (pixel) for visible light and a photoelectric conversion unit (pixel) for near-infrared light are formed on the same substrate (chip). Adjacent pixels are electrically isolated from each other by an element isolation unit embedded in a groove portion, and color mixing between adjacent pixels is suppressed. Generally, the characteristics of the pixel for visible light need to satisfy sensitivity, pixel capacity (saturation charge amount), and color mixing suppression. Meanwhile, the characteristics of the pixel for near-infrared light need to satisfy quantum efficiency and color mixing suppression.

CITATION LIST

Patent Literature

Patent Literature 1: Japanese Patent Application Laid-open No. 2017-139286

DISCLOSURE OF INVENTION

Technical Problem

Since near-infrared light has an absorbing coefficient of the silicon (Si) constituting a substrate lower than that of visible light, it is photoelectrically converted even at a depth deep from the Si light receiving surface. Therefore, in the case where the element isolation unit is formed by embedding an oxide film in the groove portion, since the light shielding performance against near-infrared light is low, near-infrared light easily leaks from the pixel for near-infrared light to the adjacent pixel through the element isolation unit, and color mixing easily occurs.

Meanwhile, in the case where the element isolation unit is formed by embedding an oxide film and a metal film in the groove portion, since the light shielding capability is high also against near-infrared light, it is possible to suppress color mixing caused by the pixel for near-infrared light. However, since the element isolation unit is formed by embedding both the oxide film and the metal film in the groove portion, the width of the element isolation unit is wider. As a result, there is a problem that the volume of the photodiode in the pixel for visible light is reduced and the saturation charge amount is reduced.

It is an object of the present technology to provide a solid-state imaging device and an electronic apparatus that are capable of achieving both suppression of color mixing caused by a pixel for near-infrared light and securement of a saturation charge amount of a pixel for visible light in the case where the pixel for visible light and the pixel for near-infrared light are formed on the same substrate.

Solution to Problem

A solid-state imaging device according to an embodiment of the present technology includes: a substrate; a first photoelectric conversion unit formed on the substrate; a second photoelectric conversion unit that is formed on the substrate and adjacent to the first photoelectric conversion unit; a third photoelectric conversion unit that is formed on the substrate and adjacent to the second photoelectric conversion unit; infrared absorbing filters selectively disposed on a light incident surface side of the first photoelectric conversion unit and the second photoelectric conversion unit; a first color filter disposed on the light incident surface side of the first photoelectric conversion unit; a second color filter disposed on the light incident surface side of the second photoelectric conversion unit; a third color filter disposed on the light incident surface side of the third photoelectric conversion unit; a first element isolation unit disposed between the first photoelectric conversion unit and the second photoelectric conversion unit; and a second element isolation unit disposed between the second photoelectric conversion unit and the third photoelectric conversion unit, in which a cross-sectional area of the first element isolation unit along a direction in which the first photoelectric conversion unit and the second photoelectric conversion unit are aligned is larger than a cross-sectional area of the second element isolation unit along a direction in which the second photoelectric conversion unit and the third photoelectric conversion unit are aligned.

An electronic apparatus according to the present technology includes: a solid-state imaging device including a substrate, a first photoelectric conversion unit formed on the substrate, a second photoelectric conversion unit that is formed on the substrate and adjacent to the first photoelectric conversion unit, a third photoelectric conversion unit that is formed on the substrate and adjacent to the second photoelectric conversion unit, infrared absorbing filters selectively disposed on a light incident surface side of the first photoelectric conversion unit and the second photoelectric conversion unit, a first color filter disposed on the light incident surface side of the first photoelectric conversion unit, a second color filter disposed on the light incident surface side of the second photoelectric conversion unit, a third color filter disposed on the light incident surface side of the third photoelectric conversion unit, a first element isolation unit disposed between the first photoelectric conversion unit and the second photoelectric conversion unit, and a second element isolation unit disposed between the second photoelectric conversion unit and the third photoelectric conversion unit; an optical lens that forms an image of light from a subject onto an imaging surface of the solid-state imaging device; and a signal processing circuit that performs signal processing on a signal output from the solid-state imaging device, in which a cross-sectional area of the first element isolation unit along a direction in which the first photoelectric conversion unit and the second photoelectric conversion unit are aligned is larger than a cross-sectional area of the second element isolation unit along a direction in which the second photoelectric conversion unit and the third photoelectric conversion unit are aligned.

MODE(S) FOR CARRYING OUT THE INVENTION

Hereinafter, first to ninth embodiments of the present technology will be described with reference to the drawings. In the description of the drawings referred to in the following description, the same or similar portions are denoted by the same or similar reference symbols. Note that, however, the drawings are schematic, and the relationship between the thickness and the plane dimensions, the ratio of the thickness of each layer, or the like, is different from the actual one. Therefore, the specific thickness and dimensions should be determined by referring to the following description. Further, it goes without saying that the drawings also include portions having different dimensional relationships and ratios from each other. Note that the effects described herein are merely illustrative and not restrictive, and may have other effects.

First Embodiment

<Electronic Apparatus and Solid-State Imaging Device>

Figure 1:
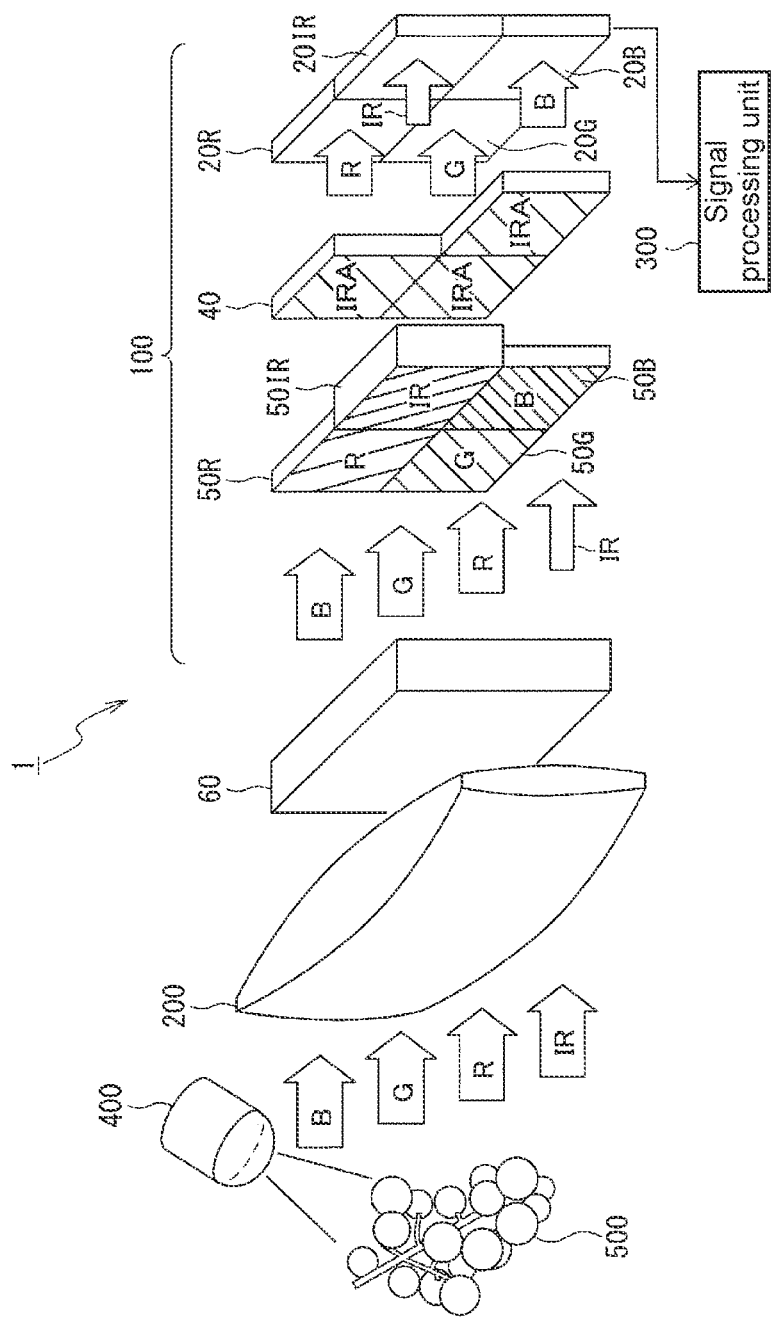
FIG. 1 is a schematic configuration diagram of an electronic apparatus according to a first embodiment of the present technology.

An electronic apparatus (camera system) 1 according to the first embodiment of the present technology includes a near-infrared light source unit 400 that applies near-infrared light to a subject 500, an optical unit (imaging lens) 200 for forming an image of the subject 500, a dual pass filter 60, light entering the dual pass filter 60 via the optical unit 200, a solid-state imaging device 100, light entering the solid-state imaging device 100 via the dual pass filter 60, and a signal processing unit 300 that processes a signal from the solid-state imaging device 100, as schematically shown in FIG. 1.

The near-infrared light source unit 400 illuminates the subject 500 with near-infrared light in a predetermined range of wavelengths. The emission wavelengths by the near-infrared light source unit 400 can be appropriately set. The near-infrared light source unit 400 may include a near infrared light-emitting diode (LED) or the like. Reflected light from the subject 500, which is based on ambient light including near-infrared light and near-infrared light from the near-infrared light source unit 400 in a predetermined range of wavelengths, enters the optical unit 200.

Figure 2:
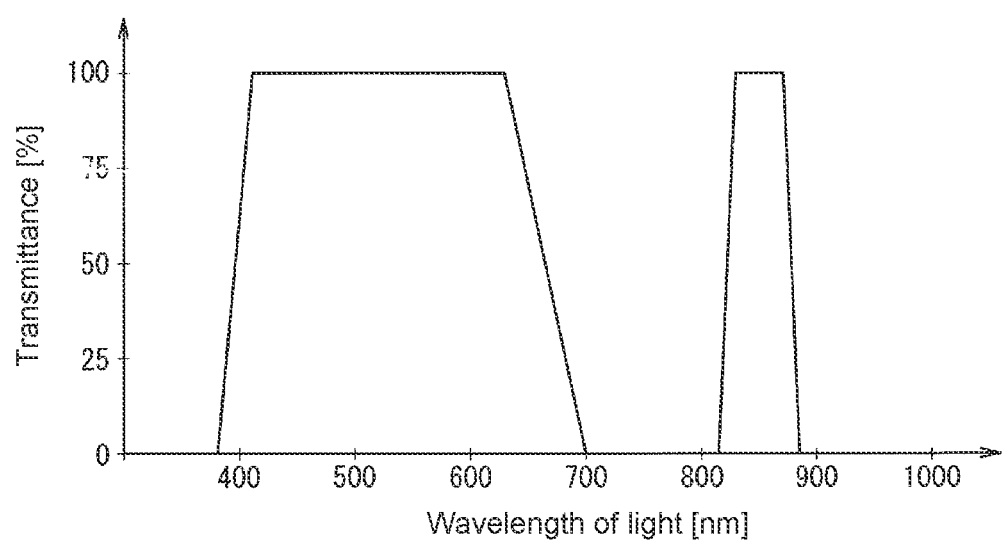
FIG. 2 is a schematic graph of the spectral transmittance of a dual pass filter.

The dual pass filter 60 has a transmission band for visible light and for near-infrared light in a predetermined range of wavelengths. The dual pass filter 60 is a filter having a configuration in which, for example, the wavelength range of 650 nm to 750 nm is absorbed by a cutoff band absorbing layer, and the spectral properties of the transmission band in the near infrared range are controlled by a dielectric multilayer film. FIG. 2 shows a schematic graph of the spectral transmittance of the dual pass filter 60. FIG. 2 illustrates a case where the center of the transmission band on the near-infrared side of the dual pass filter 60 is set to approximately 850 nm and the width is set to approximately 80 nm. Note that the transmission band on the near-infrared side of the dual pass filter 60 can be appropriately set.

The solid-state imaging device 100 shown in FIG. 1 includes photoelectric conversion units 20G, 20B, 20IR, and 20R, infrared absorbing filters (infrared absorbing films) 40 disposed on the light incident surface side of the photoelectric conversion units 20G, 20B, 20IR, and 20R, and color filters 50G, 50B, 50IR, and 50R disposed on the light incident surface side of the infrared absorbing filters 40. The solid-state imaging device 100 has, for example, a megapixel configuration. However, for convenience of description, FIG. 1 shows the photoelectric conversion units 20G, 20B, 20IR, and 20R corresponding to four pixels as a group unit. The photoelectric conversion units 20G, 20B, 20IR, and 20R include the photoelectric conversion units 20G, 20B, and 20R for visible light, and the photoelectric conversion unit 20IR for near-infrared light. The photoelectric conversion units 20G, 20B, and 20R for visible light include the photoelectric conversion unit 20G for green, the photoelectric conversion unit 20B for blue, and the photoelectric conversion unit 20R for red.

The color filters 50G, 50B, 50IR, and 50R include the color filters 50G, 50B, and 50R for visible light and the color filter 50IR for near-infrared light. The color filters 50G, 50B, and 50R for visible light include the color filter 50G for green, the color filter 50B for blue, and the color filter 50R for red. The color filter 50G for green is disposed corresponding to the photoelectric conversion unit 20G for green, and has a green transmission band. The color filter 50B for blue is disposed corresponding to the photoelectric conversion unit 20B for blue, and has a blue transmission band. The color filter 50R for red is disposed corresponding to the photoelectric conversion unit 20R for red, and has a red transmission band. The color filter 50IR for near-infrared light is disposed corresponding to the photoelectric conversion unit 20IR for near-infrared light, and has a transmission band of near-infrared light within a predetermined range of wavelengths. Note that the characters "G", "B", "IR", and "R" attached to the color filters 50G, 50B, 50IR, and 50R in FIG. 1 mean that green light, blue light, near-infrared light, and red light are transmitted therethrough, respectively.

Figure 3:
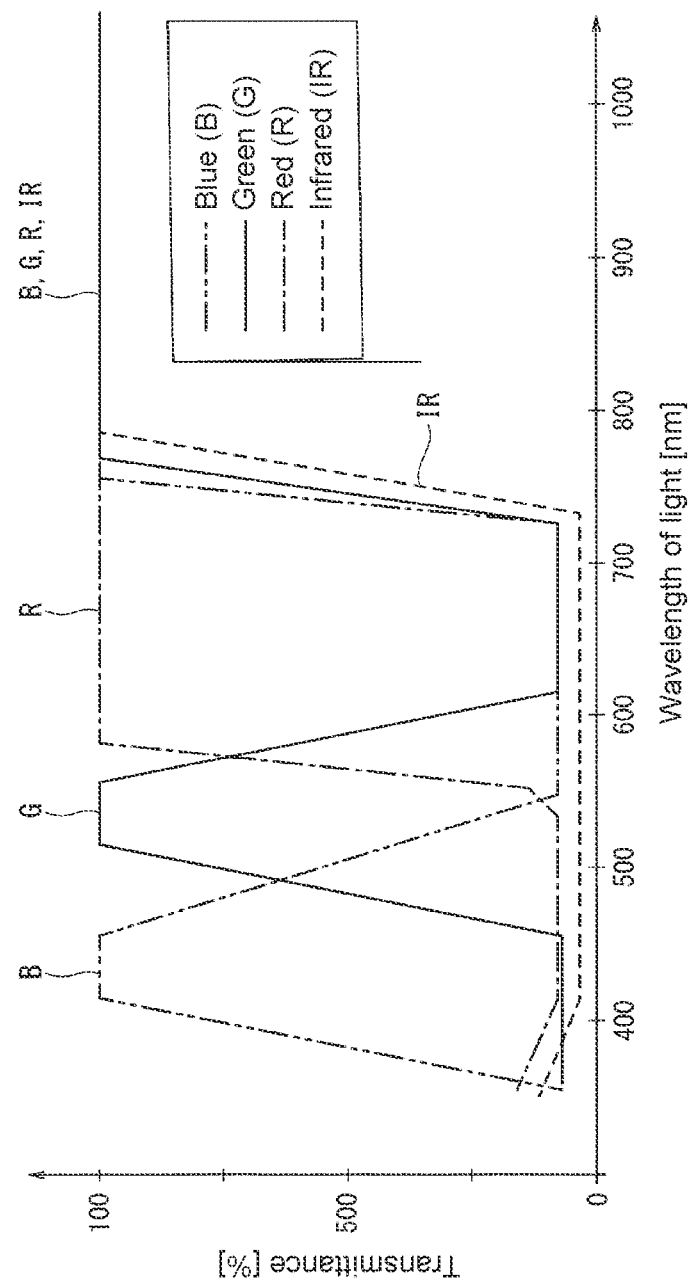
FIG. 3 is a schematic graph of the spectral transmittance of a color filter.

FIG. 3 shows a schematic graph of the spectral transmittances of the color filters 50G, 50B, 50IR, and 50R. As shown in FIG. 3, the commercially available color filters 50G, 50B, 50IR, and 50R generally exhibit the transmittance of approximately 100% at the wavelengths longer than 800 nm. That is, the light transmitted through the color filter 50R for red includes near-infrared light in a predetermined range of wavelengths in addition to red visible light. The light transmitted through the color filter 50G for green includes near-infrared light in a predetermined range of wavelengths in addition to green visible light. The light transmitted through the color filter 50B for blue includes near-infrared light in a predetermined range of wavelengths in addition to blue visible light.

Therefore, the components of near-infrared light included in the light transmitted through the color filters 50G, 50B, and 50R for visible light are absorbed by the infrared absorbing filters 40 shown in FIG. 1. The infrared absorbing filters 40 are selectively arranged corresponding to the color filters 50G, 50B, and 50R for visible light and the photoelectric conversion units 20G, 20B, and 20R for visible light. The absorbing band of near-infrared light by the infrared absorbing filters 40 may include a transmission band of near-infrared light of the dual pass filter 60. The character "IRA" attached to the infrared absorbing filters 40 of FIG. 1 means near-infrared light absorbing.

The light transmitted through the color filters 50G, 50B, and 50R for visible light reaches the photoelectric conversion units 20G, 20B, and 20R for visible light after components of near-infrared light are absorbed by the infrared absorbing filters 40, and is photoelectrically converted in the photoelectric conversion units 20G, 20B, and 20R for visible light. As a result, signals corresponding to the intensities of green, blue, and red in the reflected light of the subject 500 are output from the photoelectric conversion units 20G, 20B, and 20R for visible light.

Meanwhile, the near-infrared light transmitted through the color filter 50IR for near-infrared light reaches the photoelectric conversion unit 20IR for near-infrared light without passing through the infrared absorbing filters 40, and is photoelectrically converted in the photoelectric conversion unit 20IR for near-infrared light. As a result, the signal corresponding to the intensity of the near-infrared light in the reflected light of the subject 500 is output from the photoelectric conversion unit 20IR for near-infrared light. The signal processing unit 300 is capable of simultaneously acquiring a color image and a near infrared image by processing the signal from the solid-state imaging device 100.

Figure 4:
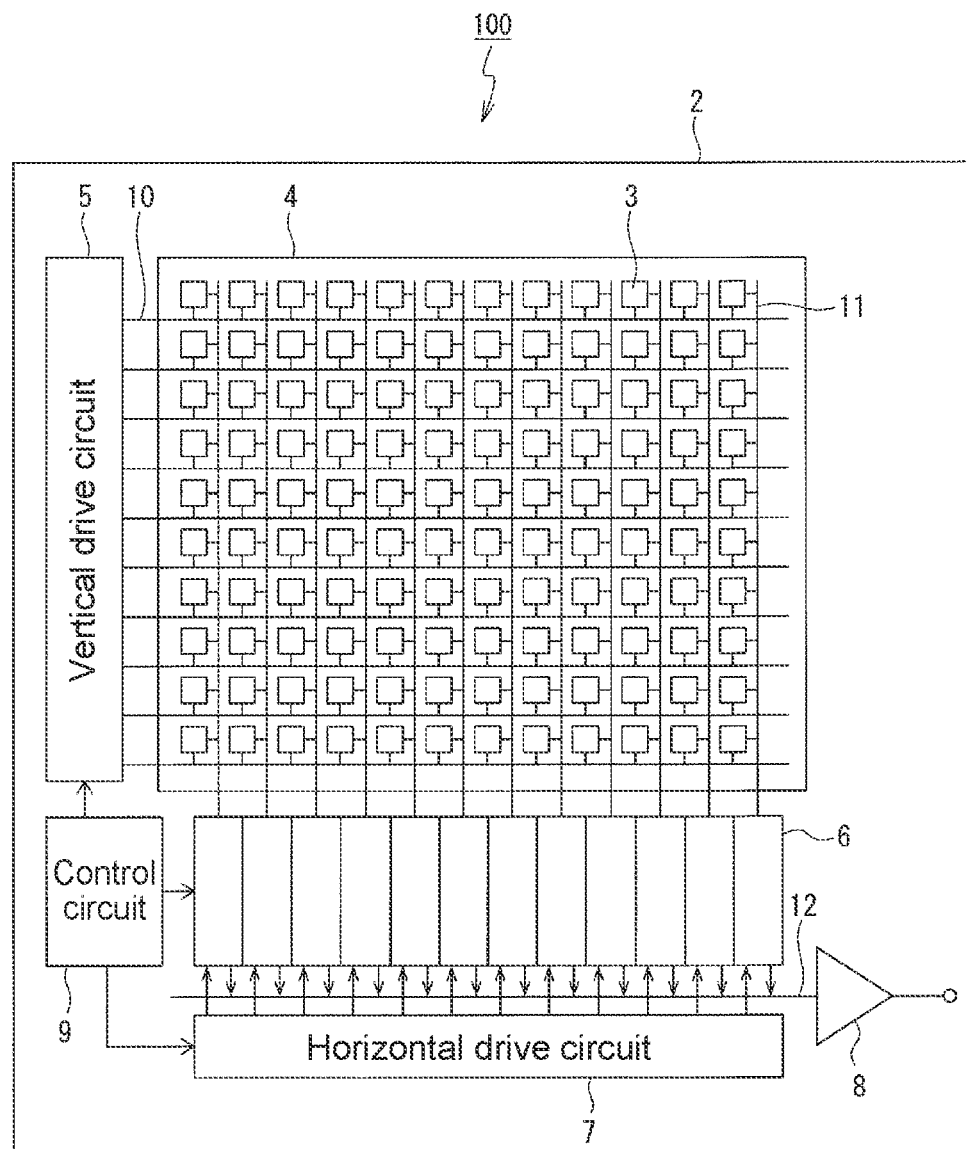
FIG. 4 is a schematic configuration diagram of a solid-state imaging device according to the first embodiment of the present technology.

Next, an example of the solid-state imaging device 100 will be described in detail. As shown in FIG. 4, the solid-state imaging device 100 includes a substrate 2, and a pixel region 4, a vertical drive circuit 5, a column signal processing circuit 6, a horizontal drive circuit 7, an output circuit 8, and a control circuit 9 formed on the substrate 2.

The pixel region 4 includes a plurality of pixels 3 arranged in a two-dimensional matrix. Each of the plurality of pixels 3 includes the plurality of photoelectric conversion units 20G, 20B, 20IR, and 20R shown in FIGS. 1, and a plurality of pixel transistors (not shown). As the plurality of pixel transistors, for example, four transistors of a transfer transistor, a reset transistor, a selection transistor, and an amplification transistor can be employed. Alternatively, three transistors excluding the selection transistor may be employed.

The vertical drive circuit 5 includes, for example, a shift register. The vertical drive circuit 5 sequentially selects a pixel drive wiring 10, supplies a pulse for driving the pixel 3 to the selected pixel drive wiring 10, and drives each of the pixels 3 on a row-by-row basis. That is, the vertical drive circuit 5 selectively scans each of the pixels 3 of the pixel region 4 sequentially on a row-by-row basis in a vertical direction, and supplies a pixel signal based on the signal charges generated by the photoelectric conversion units 20G, 20B, 20IR, and 20R of the respective pixels 3 to the column signal processing circuit 6 through a vertical signal line 11.

The column signal processing circuit 6 is disposed, for example, for each column of the pixels 3, and performs signal processing such as noise removal on the signal output from the pixels 3 in one row for each pixel column. For example, the column signal processing circuit 6 performs signal processing such as correlated double sampling (CDS) for removing pixel-specific fixed pattern noise and analog-to-digital (AD) conversion.

The horizontal drive circuit 7 includes, for example, a shift register. The horizontal drive circuit 7 sequentially outputs a horizontal scan pulse to the column signal processing circuit 6 to sequentially select the column signal processing circuit 6, and causes the selected column signal processing circuit 6 to output the pixel signal on which signal processing has been performed to a horizontal signal line 12.

The output circuit 8 performs signal processing on the pixel signal sequentially supplied from each of the column signal processing circuits 6 through the horizontal signal line 12, and outputs the pixel signal.

The control circuit 9 generates clock signals and control signals that serve as a reference for operations of the vertical drive circuit 5, the column signal processing circuit 6, the horizontal drive circuit 7, and the like, on the basis of a vertical synchronization signal, a horizontal synchronization signal, and a master clock signal. Then, the control circuit 9 outputs the generated clock signals and control signals to the vertical drive circuit 5, the column signal processing circuit 6, the horizontal drive circuit 7, and the like.

Figure 5:
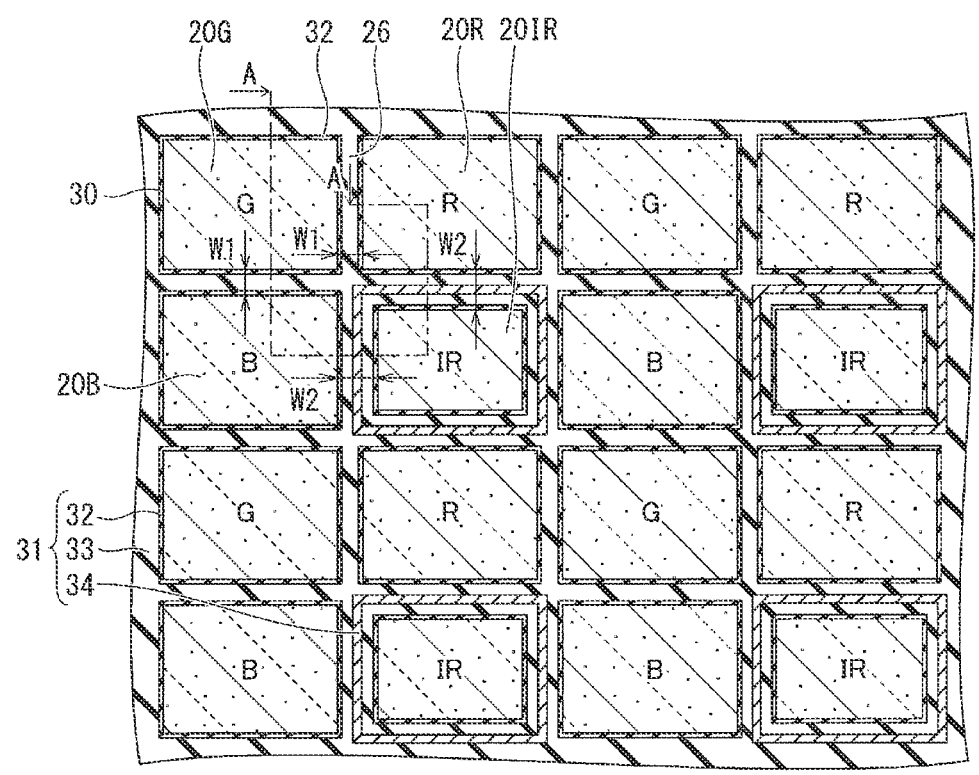
FIG. 5 is a plan view of a pixel region of the solid-state imaging device according to the first embodiment of the present technology.

A plan view of the pixel region 4 of the solid-state imaging device 100 shown in FIG. 1 is shown in FIG. 5. As shown in FIG. 5, the plurality of photoelectric conversion units 20G, 20B, 20IR, and 20R are arranged in a mosaic pattern. In FIG. 5, characters "R", "B", "G", and "IR" are schematically attached to the photoelectric conversion unit 20R for red, the photoelectric conversion unit 20B for blue, the photoelectric conversion unit 20G for green, and the photoelectric conversion unit 20IR for near-infrared light, respectively. For example, 2×2=4 photoelectric conversion units 20G, 20B, 20IR, and 20R constitute one pixel 3 shown in FIG. 4. Note that the arrangement pattern of the photoelectric conversion units 20G, 20B, 20IR, and 20R is not limited to that shown in FIG. 5, and various arrangement patterns can be employed.

FIG. 5 illustrates the case where the photoelectric conversion units 20G, 20B, and 20R for visible light, and the photoelectric conversion unit 20IR for near-infrared light are arranged at an equal pitch in the row direction and the column direction. The photoelectric conversion units 20G, 20B, 20IR, and 20R are electrically element-isolated from each other by an element isolation unit 31. The element isolation unit 31 is formed in a grid shape so as to surround the photoelectric conversion units 20G, 20B, 20IR, and 20R. Each of the opening areas of the photoelectric conversion units 20G, 20B, and 20R for visible light partitioned by the element isolation unit 31 is set larger than the opening area of the photoelectric conversion unit 20IR for near-infrared light partitioned by the element isolation unit 31.

Figure 6:
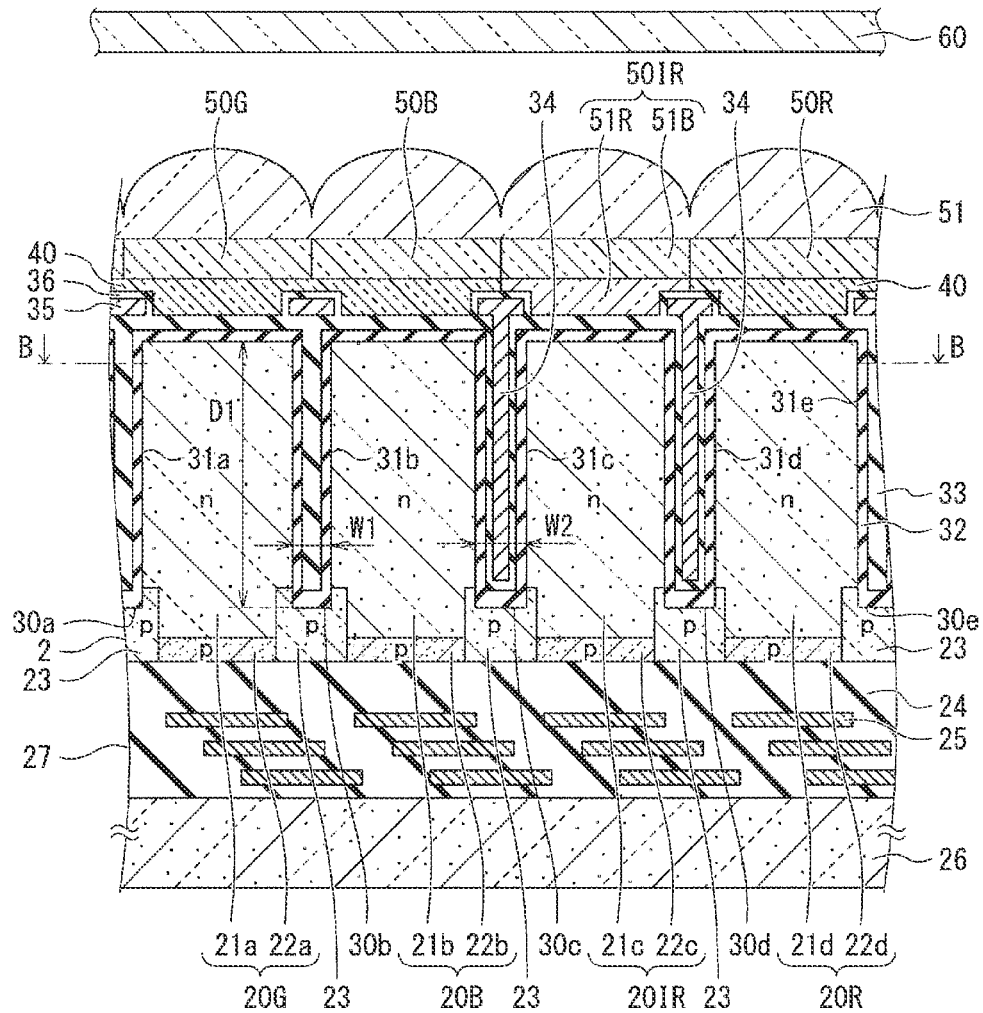
FIG. 6 is a cross-sectional view of a main part of a pixel region of the solid-state imaging device according to the first embodiment of the present technology.

FIG. 6 is a cross-sectional view of the curved portions of the dot-dash line passing through the photoelectric conversion units 20G, 20B, 20IR, and 20R in FIG. 5 cut in the perpendicular direction, as viewed from the direction A-A. A plan view of a horizontal plane in the B-B direction passing through the photoelectric conversion units 20G, 20B, 20IR, and 20R in FIG. 6 corresponds to FIG. 5. Note that as shown in FIG. 6, the photoelectric conversion units 20G, 20B, 20IR, and 20R may actually be arranged in a row.

In FIG. 6, as the solid-state imaging device 100, a back surface-illumination CMOS (Complementary Metal Oxide Semiconductor) image sensor is illustrated. Hereinafter, the surface of each member of the solid-state imaging device 100 on the light incident surface side (upper side in FIG. 6) will be referred to as the "back surface", and the surface of the solid-state imaging device 100 opposed to the light incident surface side (lower side in FIG. 6) will be referred to as the "front surface".

FIG. 6 also illustrates the dual pass filter 60 disposed on the light incident surface (back surface) of the solid-state imaging device 100. Note that the dual pass filter 60 may be included in the element of the solid-state imaging device 100. As shown in FIG. 2, the dual pass filter 60 has a transmission band in visible light and near-infrared light in a predetermined range of wavelengths. The dual pass filter 60 can include, for example, a cutoff band absorbing layer that absorbs a boundary range (cut-off band) between visible light and near-infrared light, and a dielectric multilayer film of approximately several tens to a hundred and several tens of layers for controlling a transmission band in the near infrared range. The cutoff band has a wavelength of, for example, approximately 650 nm to 750 nm. In the cutoff band absorbing layer, a well-known pigment or dye can be used as a dye. For example, the cutoff band absorbing layer contains a compound such as a squarylium-based compound, a phthalocyanine-based compound, and a cyanine-based compound as a dye.

The photoelectric conversion units 20G, 20B, 20IR, and 20R are formed on the substrate 2 of the solid-state imaging device 100. FIG. 6 illustrates the case where the photoelectric conversion unit 20G for green is adjacent to the photoelectric conversion unit 20B for blue, the photoelectric conversion unit 20B for blue is adjacent to the photoelectric conversion unit 20IR for near-infrared light, and the photoelectric conversion unit 20IR for near-infrared light is adjacent to the photoelectric conversion unit 20R for red.

As the substrate 2, for example, a semiconductor substrate formed of silicon (Si) can be used. The photoelectric conversion unit 20G has an n-type semiconductor region 21a and a p-type semiconductor region 22a provided on the front surface side of the substrate 2, and the p-type semiconductor region 22a and the n-type semiconductor region 21a constitute a photodiode. The photoelectric conversion unit 20B has an n-type semiconductor region 21b and a p-type semiconductor region 22b provided on the front surface side of the substrate 2, and the p-type semiconductor region 22b and the n-type semiconductor region 21b constitute a photodiode. The photoelectric conversion unit 20IR has an n-type semiconductor region 21c and a p-type semiconductor region 22c provided on the front surface side of the substrate 2, and the p-type semiconductor region 22c and the n-type semiconductor region 21c constitute a photodiode. The photoelectric conversion unit 20R has an n-type semiconductor region 21d and a p-type semiconductor region 22d provided on the front surface side of the substrate 2, and the p-type semiconductor region 22d and the n-type semiconductor region 21d constitute a photodiode. Note that in each of the photoelectric conversion units 20G, 20B, 20IR, and 20R, a p-type semiconductor region may be further provided on the back surface side of the substrate 2, and the p-type semiconductor region and the n-type semiconductor regions 21a to 21d may constitute photodiodes.

In the photoelectric conversion units 20G, 20B, 20IR, and 20R, signal charges corresponding to the amount of incident light are generated, and the generated signal charges are accumulated in the n-type semiconductor regions 21a to 21d. Electrons responsible for dark current generated at the interface of the substrate 2 are absorbed by the holes, which are majority carriers of the p-type semiconductor regions 22a to 22d formed on the substrate 2, and thus, dark current is suppressed. A p-well region 23 is formed between the photoelectric conversion units 20G, 20B, 20IR, and 20R on the front surface side of the substrate 2. A floating diffusion unit (not shown) or the like is formed in the p-well region 23.

As shown in FIG. 6, the element isolation unit 31 shown in FIG. 5 includes element isolation units 31a to 31e provided between the photoelectric conversion units 20G, 20B, 20IR, and 20R. The element isolation unit 31a is disposed between the photoelectric conversion unit for blue (illustration omitted) and the photoelectric conversion unit 20G for green. The element isolation unit 31b is disposed between the photoelectric conversion unit 20G for green and the photoelectric conversion unit 20B for blue. The element isolation unit 31c is disposed between the photoelectric conversion unit 20B for blue and the photoelectric conversion unit 20IR for infrared light. The element isolation unit 31d is disposed between the photoelectric conversion unit 20IR for infrared light and the photoelectric conversion unit 20R for red. The element isolation unit 31e is disposed between the photoelectric conversion unit 20R for red and the photoelectric conversion unit 20G for green shown on the left side of FIG. 6.

The element isolation units 31a to 31e are provided in groove portions 30a to 30e formed from the back surface side of the substrate 2 toward the depth direction. The depth of the groove portions 30a to 30e is favorably, for example, greater than or equal to the depth reaching the p-well region 23 where a pixel transistor is formed, and less than the depth reaching the floating diffusion unit or source-drain region formed in the p-well region 23. For example, in the case where the depth of the floating diffusion unit, the source region, and the drain region is less than 1 µm, the depth of the groove portions 30a to 30e is approximately 0.25 to 5.0 µm.

In the first embodiment of the present technology, the shapes of the element isolation units 31c and 31d for separating the photoelectric conversion units 20B and 20R for visible light and the photoelectric conversion unit 20IR for near-infrared light from each other, and the shapes of the element isolation units 31a, 31b, and 31e for separating the photoelectric conversion units 20G, 20B and 20R for visible light from each other are different from each other. That is, the cross-sectional areas of the element isolation units 31c and 31d along the direction in which the photoelectric conversion units 20B and 20R for visible light and the photoelectric conversion unit 20IR for near-infrared light are aligned are larger than the cross-sectional areas of the element isolation units 31a, 31b, and 31e along the direction in which the photoelectric conversion units 20G, 20B, and 20R for visible light are aligned.

For example, as shown in FIG. 6, the number of members constituting the element isolation units 31c and 31d is larger than the number of members constituting the element isolation units 31a, 31b, and 31e. The element isolation units 31a, 31b, and 31e are formed by selectively embedding insulating films 32 and 33. Meanwhile, the element isolation units 31c and 31d are formed by selectively embedding the insulating films 32 and 33 and a light-shielding layer 34. Since the element isolation units 31c and 31d further include the light-shielding layer 34, a width W2 of the element isolation units 31c and 31d is wider than a width W1 of the element isolation units 31a, 31b, and 31e. For example, the width W1 of the element isolation units 31a, 31b, and 31e is approximately 20 nm to 50 nm. The width W2 of the element isolation units 31c and 31d is approximately 50 nm to 100 nm, and may be approximately 5 nm to 50 nm wider than the width W1 of the element isolation units 31a, 31b, and 31e. A depth D1 of the element isolation unit 31a, 31b, 31c, and 31d is substantially the same, and is, for example, approximately 0.2 µm to 1.0 µm.

The insulating films 32 and 33 are provided in the groove portions 30a to 30e and include the insulating film 32 that is a fixed charge film having fixed charges and the insulating film 33 that is provided in the groove portions 30a to 30e via the insulating film 32. The insulating film 32 is formed on the side wall surface and the bottom surface of the groove portions 30a to 30e, and on the entire back surface side of the substrate 2. As the material of the insulating film 32, for example, a high refractive index material film or a high dielectric film having negative charges capable of generating fixed charges to strengthen the pinning can be used. Specifically, an oxide, a nitride, or the like containing at least one element of hafnium (Hf), aluminum (Al), zirconium (Zr), tantalum (Ta), or titanium (Ti) can be employed. As the material of the insulating film 32, for example, hafnium oxide (HfO$_2$) is more favorable. The insulating film 32 may be a single layer film, and may be a stacked film formed of the same material or different materials.

The insulating film 33 is provided in the groove portions 30c and 30d via the insulating films 32 and 33. As the material of the insulating film 33, for example, an oxide film, a nitride film, or the like having a refractive index different from that of the insulating film 32 can be employed. Specifically, at least one of silicon oxide (SiO$_2$), silicon nitride (Si$_3$N$_4$), or silicon oxinitride (SiON) can be employed. As the material of the insulating film 33, for example, a material having no positive fixed charges or a material having less positive fixed charges is favorable.

As the material of the light-shielding layer 34, for example, a material capable of blocking light can be employed. Specifically, a metal material such as aluminum (Al), tungsten (W), copper (Cu), and chromium (Cr) and a dielectric material such as polysilicon can be employed. As shown in FIG. 5, the light-shielding layer 34 is formed in a frame-like planar pattern so as to surround the photoelectric conversion unit 20IR for near-infrared light. Note that the light-shielding layer 34 is not limited to the frame-like planar pattern. For example, the light-shielding layer 34 may be formed in each of the four sides forming a rectangular shape of the photoelectric conversion unit 20IR for near-infrared light in a straight line.

As an example of the method of forming the element isolation units 31a to 31e shown in FIG. 6, the groove portions 30a to 30e are formed from the back surface side of the substrate 2 to the depth direction by etching such as reactive ion etching (RIE) after an etching mask is formed on the back surface of the substrate 2 using a lithographic technology. At this time, the groove portions 30a to 30e are formed so that the width W2 of the groove portions 30c and 30d is wider than the width W1 of the groove portions 30a, 30b, and 30e. Then, the etching mask is removed. Subsequently, the insulating film 32 is deposited on the back surface of the substrate 2 and in the groove portions 30a to 30e by a CVD method, a PVD method, or the like. Further, the insulating film 33 is deposited on the insulating film 32 by a CVD method or the like to embed the relatively thin groove portions 30a, 30b, and 30e with the insulating film 33 via the insulating film 32, and the relatively thick groove portions 30c and 30d are not completely embedded with the insulating film 33. Then, a metal film serving as the light-shielding layer 34 and a metal film serving as a light-shielding film 35 are deposited on the insulating film 33 by a CVD method or the like, and the relatively thick groove portions 30c and 30d are embedded with the light-shielding layer 34 via the insulating films 32 and 33, whereby the element isolation units 31a to 31e can be formed.

The light-shielding film 35 is formed in a grid shape on a part of the back surface side of the insulating film 33 so as to open the respective light receiving surfaces of the plurality of photoelectric conversion units 20G, 20B, 20IR, and 20R. The light-shielding film 35 is connected to the light-shielding layer 34 embedded in the groove portions 30c and 30d. The light-shielding film 35 may be formed integrally with the light-shielding layer 34 by depositing and patterning a metal film or the like serving as the light-shielding layer 34 and the light-shielding film 35. As the material of the light-shielding film 35, for example, a material capable of blocking light can be employed. Specifically, a metal material such as aluminum (Al), tungsten (W), copper (Cu), and chromium (Cr) and a dielectric material such as polysilicon can be employed. The light-shielding film 35 may be formed of the same material as that of the light-shielding layer 34, or may be formed of a material different from that of the light-shielding layer 34.

A flattening film 36 is disposed to cover the side surface and back surface of the light-shielding film 35. As the flattening film 36, silicon oxide, silicon nitride, silicon oxynitride, organic SOG (spin-on glass), a polyimide-based resin, a fluorine-based resin, or the like can be used. The flattening film 36 is provided with an opening using a well-known patterning technology. The infrared absorbing filters 40 are disposed on the opening of the flattening film 36. Note that the infrared absorbing filters 40 may be disposed on the back surface, which is the flat surface of the flattening film 36, without forming an opening on the flattening film 36.

The infrared absorbing filters 40 are selectively arranged at positions corresponding to the photoelectric conversion units 20G, 20B, and 20R for visible light. The infrared absorbing filters 40 may include one to several layers containing a dye, or may include several tens of dielectric multilayers. The infrared absorbing filters 40 can be formed by, for example, spin-coating a material containing a dye. The infrared absorbing filters 40 may contain, as a dye, a compound such as a squarylium-based compound, a phthalocyanine-based compound, and a cyanine-based compound.

The color filters 50G, 50B, and 50R for visible light are arranged on the back surface (light incident surface) side of the infrared absorbing filters 40. The color filters 50G, 50B, and 50R for visible light may include an organic material-based layer using an organic compound such as a pigment and a dye. Note that a complementary color filter that causes a specific wavelength such as cyan, magenta, and yellow to be transmitted therethrough may be used in some cases. The color filters 50G, 50B, and 50R for visible light include the color filter 50G for green, the color filter 50B for blue, and the color filter 50R for red. The color filter 50G for green is disposed corresponding to the photoelectric conversion unit 20G for green, and has a transmission band of near-infrared light within a predetermined range of wavelengths in addition to a green transmission band as shown in FIG. 3. The color filter 50B for blue is disposed corresponding to the photoelectric conversion unit 20B for blue, and has a transmission band of near-infrared light within a predetermined range of wavelengths in addition to a blue transmission band as shown in FIG. 3. The color filter 50R for red is disposed corresponding to the photoelectric conversion unit 20R for red, and has a transmission band of near-infrared light within a predetermined range of wavelengths in addition to a red transmission band as shown in FIG. 3.

The color filter 50IR for near-infrared light is disposed corresponding to the photoelectric conversion unit 20IR for near-infrared light. The color filter 50IR for near-infrared light may include an organic-based material layer using an organic compound such as a pigment and a dye. For example, the color filter 50IR for near-infrared light can be formed by stacking a color filter 51B for blue and a color filter 51R for red. The color filter 51B for blue and the color filter 51R for red are capable of absorbing blue, red, and green components and causing near-infrared light to be transmitted therethrough. Note that the configuration of the color filter 50IR for near-infrared light is not limited thereto, and may be, for example, a single layer film that causes near-infrared light to be transmitted therethrough.

On the back surface side of the color filters 50G, 50B, 50IR, and 50R, an on-chip lens 51 is disposed corresponding to each of the pixel 3. The on-chip lens 51 collects the irradiation light, and causes the collected light to efficiently enter the photoelectric conversion units 20G, 20B, 20IR, and 20R in the substrate 2 via the color filters 50G, 50B, 50IR, and 50R. The on-chip lens 51 may be formed of an insulating material that does not have light absorbing properties. Examples of the insulating material that does not have light absorbing properties include silicon oxide, silicon nitride, silicon oxynitride, organic SOG, a polyimide-based resin, and a fluorine-based resin.

A wiring layer 24 is formed on the front surface side of the substrate 2. The wiring layer 24 includes the wiring 25 stacked to have a plurality of layers (three layers in FIG. 6) via an interlayer insulating film 27. The pixel transistor constituting the corresponding pixel 3 is driven via the wiring 25 having a plurality of layers formed in the wiring layer 24.

A support substrate 26 is formed on the front surface side of the wiring layer 24. The support substrate 26 is a substrate for ensuring the intensity of the substrate 2 in the manufacturing stage of the solid-state imaging device 100. For example, silicon (Si) can be used as the material of the support substrate 26.

In the solid-state imaging device 100 according to the first embodiment of the present technology, light is applied from the back surface side of the substrate 2, the applied light is transmitted through the on-chip lens 51 and the color filters 50, and the transmitted light is photoelectrically converted in the photoelectric conversion units 20G, 20B, 20IR, and 20R, whereby signal charges are generated. Then, the generated signal charges are output via the pixel transistor formed on the front surface side of the substrate 2 as a pixel signal in the vertical signal line 11 shown in FIG. 4 formed of the wiring 25.

Figure 7:
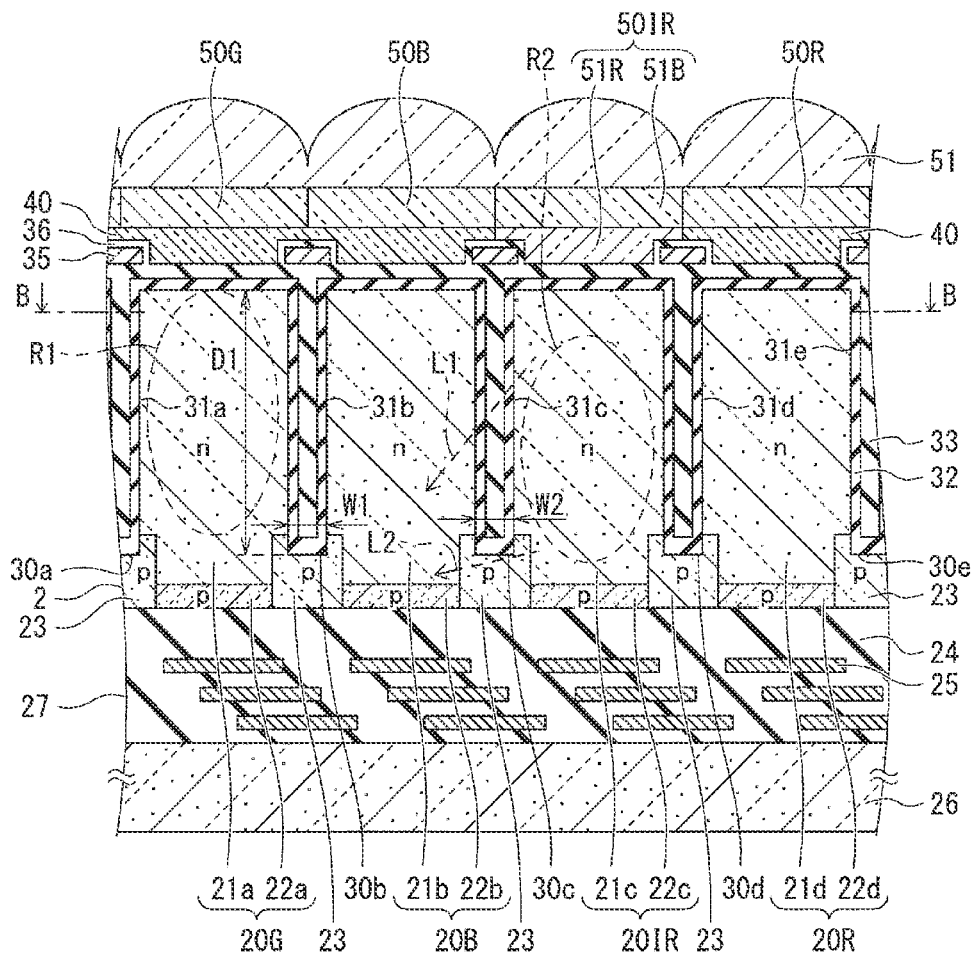
FIG. 7 is a cross-sectional view of a main part of a pixel region of a solid-state imaging device according to a First Comparative Example.

Here, the description will be made in comparison with a solid-state imaging device according to a First Comparative Example. As shown in FIG. 7, the solid-state imaging device according to the First Comparative Example is different from the configuration of the first embodiment of the present technology shown in FIG. 6 in that all the element isolation units 31a to 31e are configured by uniformly embedding the insulating films 32 and 33. The width W1 of the element isolation units 31a, 31b, and 31e is substantially the same as the width W2 of the element isolation units 31c and 31d. Since near-infrared light has an absorbing coefficient of Si constituting the substrate 2 lower than that of visible light, it is photoelectrically converted even at a depth deep from the Si light receiving surface, whereby the path to go between pixels becomes longer. In FIG. 7, a photoelectric conversion region R1 of visible light is schematically shown at the position of the photoelectric conversion unit 20G for green, and a photoelectric conversion region R2 of infrared light deeper than the photoelectric conversion region R1 of visible light is schematically shown at the position of the photoelectric conversion unit 20IR of near-infrared light. In the case where all the element isolation units 31a to 31e are formed by embedding the insulating films 32 and 33 as in the solid-state imaging device according to the First Comparative Example, the light shielding performance against near-infrared light is low, and leakage light L1 via the element isolation units 31c and 31d easily occurs. Further, leakage light L2 via the cut at the lower end of the element isolation units 31a to 31e also easily occurs. Therefore, color mixing due to the photoelectric conversion unit 20IR of near-infrared light easily occurs.

Figure 8:
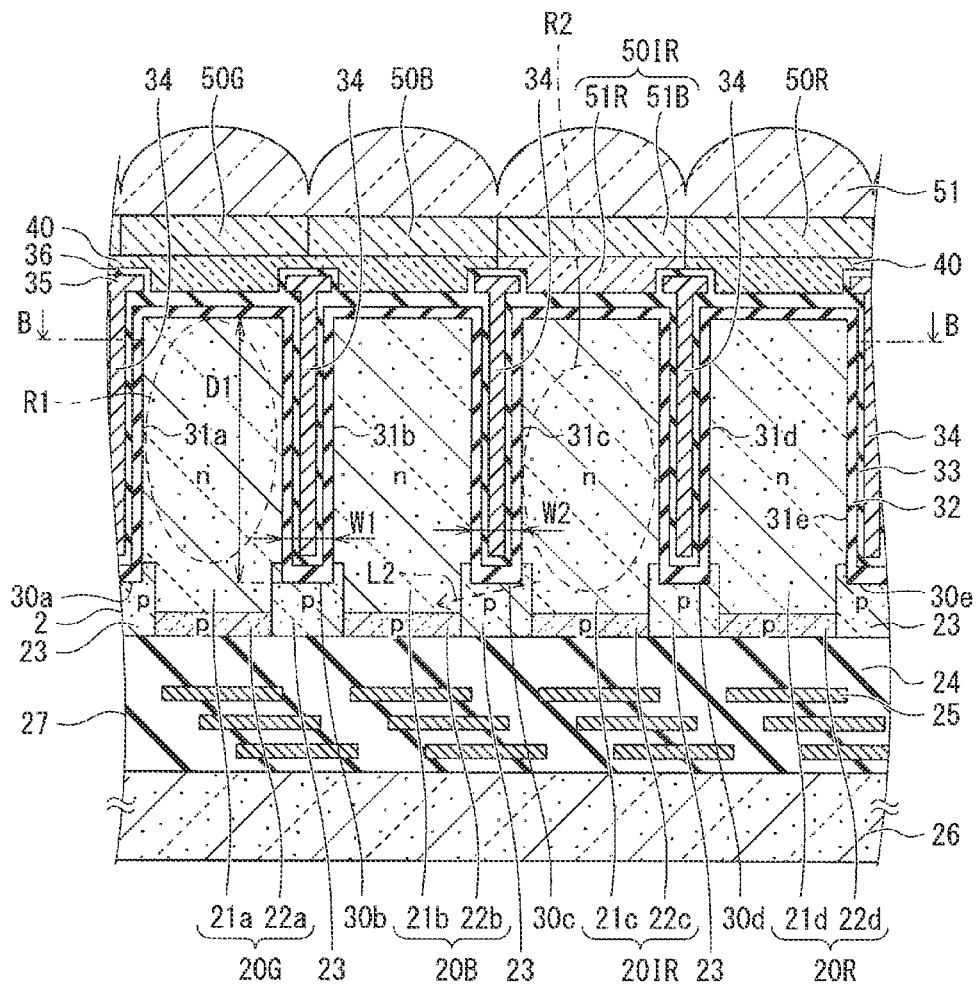
FIG. 8 is a cross-sectional view of a main part of a pixel region of a solid-state imaging device according to a Second Comparative Example.

In addition, the description will be made in comparison with a solid-state imaging device according to a Second Comparative Example. As shown in FIG. 8, the solid-state imaging device according to the Second Comparative Example is different from the configuration according to the first embodiment of the present technology shown in FIG. 6 in that all the element isolation units 31a to 31e are configured by uniformly embedding the insulating films 32 and 33 and the light-shielding layer 34. The width W1 of the element isolation units 31a, 31b, and 31e is substantially the same as the width W2 of the element isolation units 31c and 31d. In the solid-state imaging device according to the Second Comparative Example, since the light shielding capability for near-infrared light by the light-shielding layer 34 is high, the leakage light via the element isolation units 31c and 31d can be suppressed. However, since both the insulating film 33 and the light-shielding layer 34 are embedded in the groove portions 30a to 30e, the width W1 of the element isolation unit 31a, 31b, and 31e, and the width W2 of the element isolation units 31c and 31d become uniformly wider. Therefore, the volume is reduced uniformly in all the photoelectric conversion units 20G, 20B, 20IR, and 20R, and the saturation charge amount is reduced in the photoelectric conversion units 20G, 20B, 20IR, and 20R.

In accordance with the solid-state imaging device according to the first embodiment of the present technology shown in FIG. 6 in comparison with the First and Second Comparative Examples, by selectively configuring the element isolation units 31c and 31d with the insulating films 32 and 33 and the light-shielding layer 34, the light shielding performance against near-infrared light is high in the photoelectric conversion unit 20IR for near-infrared light, leakage light from the photoelectric conversion unit 20IR for near-infrared light via the element isolation units 31c and 31d can be suppressed, and color mixing caused by the photoelectric conversion unit 20IR for near-infrared light can be suppressed. Further, since the width W2 of the element isolation units 31c and 31d around the photoelectric conversion unit 20IR for near-infrared light is relatively wide and the width W1 of the element isolation units 31a, 31b, and 31e is relatively narrow, it is possible to suppress a reduction in the volume of the photoelectric conversion units 20G, 20B, and 20R of visible light by reducing the volume of the photoelectric conversion unit 20IR for near-infrared light. Therefore, the saturation charge amount in the photoelectric conversion unit 20G, 20B, and 20R of visible light can be ensured.

As described above, in accordance with the solid-state imaging device 100 according to the first embodiment of the present technology, it is possible to achieve both suppression of color mixing caused by a pixel for near-infrared light and securement of a saturation charge amount of a pixel for visible light in the case where the pixel for visible light and the pixel for near-infrared light are formed in the same substrate.

Second Embodiment

Figure 9:
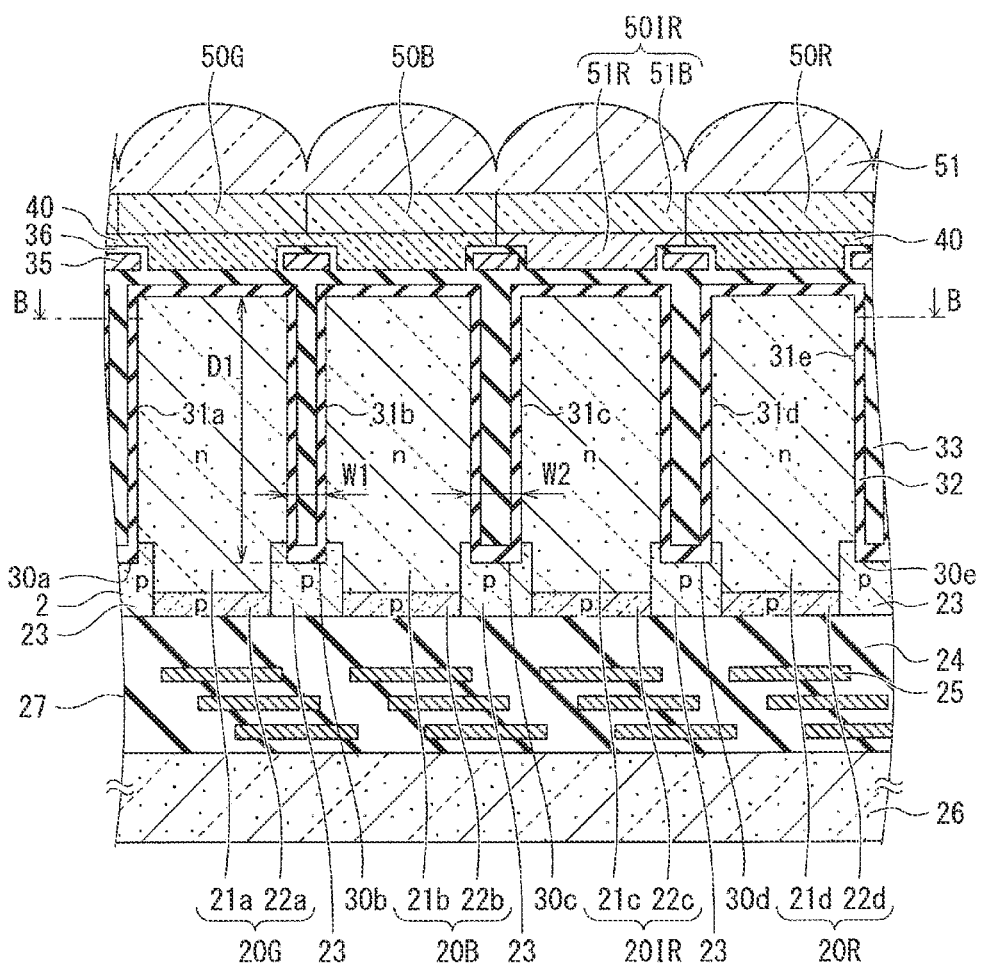
FIG. 9 is a cross-sectional view of a main part of a pixel region of a solid-state imaging device according to a second embodiment of the present technology.

As shown in FIG. 9, a solid-state imaging device according to a second embodiment of the present technology is common to the configuration according to the first embodiment of the present technology shown in FIG. 6 in that the width W2 of the element isolation units 31c and 31d for separating the photoelectric conversion units 20B and 20R for visible light and the photoelectric conversion unit 20IR for near-infrared light from each other is wider than the width W1 of the element isolation units 31a, 31b, and 31e for separating the photoelectric conversion units 20G, 20B, and 20R for visible light from each other. However, the solid-state imaging device is different from the configuration according to the first embodiment of the present technology shown in FIG. 6 in that the element isolation units 31c and 31d do not have the light-shielding layer 34 and all the element isolation units 31a to 31e are configured by uniformly embedding the insulating films 32 and 33.

At the time of manufacturing the solid-state imaging device according to the second embodiment of the present technology, it only needs to form a mask pattern so that the width W1 of the groove portions 30a, 30b, and 30e and the width W2 of the groove portions 30c and 30d differ, and perform etching.

In accordance with the solid-state imaging device according to the second embodiment of the present technology, even in the case where all the element isolation units 31a to 31e are configured by uniformly embedding the insulating films 32 and 33, leakage of near-infrared light from the photoelectric conversion unit 20IR for near-infrared light to the photoelectric conversion units 20B and 20R for visible light via the element isolation units 31a, 31b, and 31e can be reduced by selectively making the width W2 of the element isolation units 31c and 31d wider than the width W1 of the element isolation units 31a, 31b, and 31e. As a result, it is possible to suppress color mixing caused by the photoelectric conversion unit 20IR for near-infrared light while securing the saturation charge amount of the photoelectric conversion units 20G, 20B, and 20R for visible light.

Third Embodiment

Figure 10:
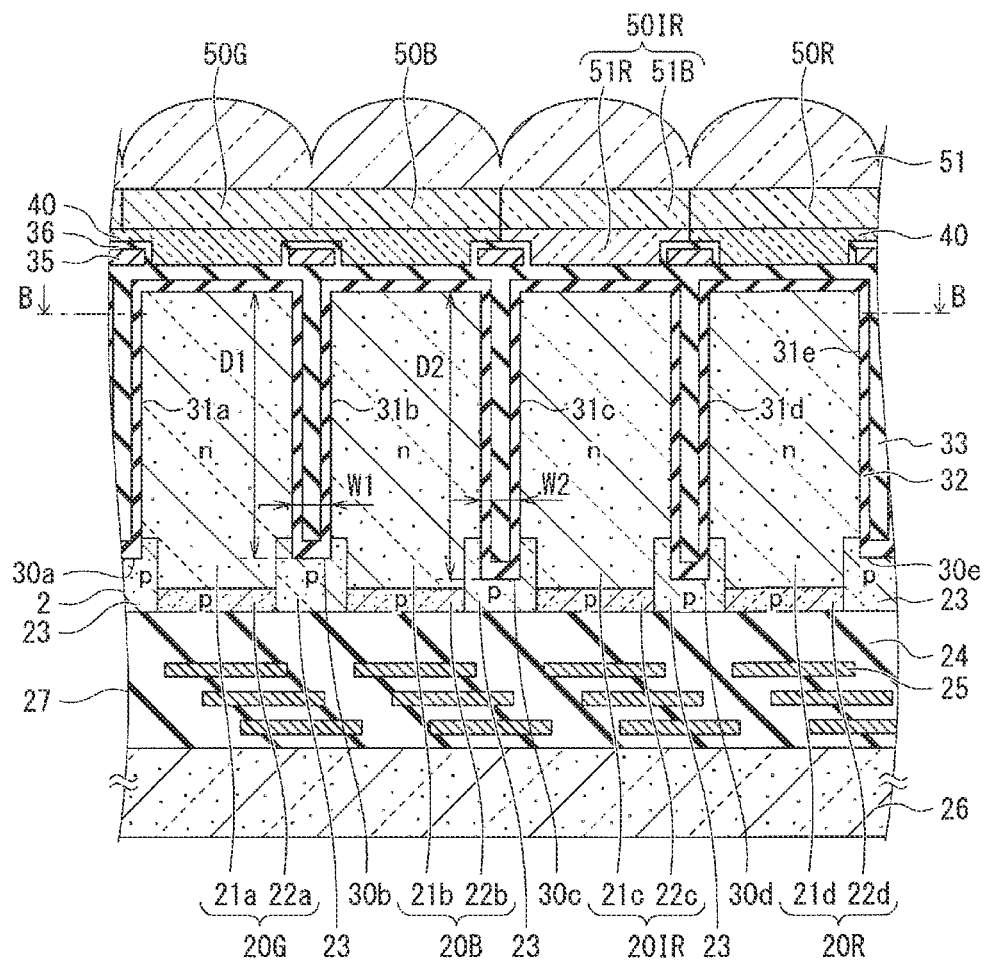
FIG. 10 is a cross-sectional view of a main part of a pixel region of a solid-state imaging device according to a third embodiment of the present technology.

As shown in FIG. 10, a solid-state imaging device according to a third embodiment of the present technology is common to the configuration according to the second embodiment of the present technology shown in FIG. 9 in that the element isolation units 31c and 31d for separating the photoelectric conversion units 20B and 20R for visible light and the photoelectric conversion unit 20IR for near-infrared light do not have the light-shielding layer 34 and all the element isolation units 31a to 31e are configured by uniformly embedding the insulating film 32 and 33. However, the solid-state imaging device is different from the configuration according to the second embodiment of the present technology shown in FIG. 9 in that the width W2 of the element isolation units 31c and 31d is substantially the same as the width W1 of the element isolation units 31a, 31b, and 31e for separating the photoelectric conversion units 20G, 20B and 20R for visible light from each other and a depth D2 of the element isolation units 31c and 31d is deeper than the depth D1 of the element isolation units 31a, 31b, and 31e. For example, the depth D2 of the element isolation units 31c and 31d is, for example, approximately 0.5 μm to 1.5 μm, and may be approximately 0.1 μm to 0.5 μm deeper than the depth of the depth D1 of the element isolation units 31a, 31b, and 31e.

At the time of manufacturing the solid-state imaging device according to the third embodiment of the present technology, it only needs to sequentially and separately perform the mask pattern forming step and the etching step for forming the relatively shallow groove portions 30a, 30b, and 30e and the mask pattern forming step and the etching step for forming the relatively deep groove portions 30c and 30d.

In accordance with the solid-state imaging device according to the third embodiment of the present technology, even in the case where all the element isolation units 31a to 31e are configured by uniformly embedding the insulating films 32 and 33, leakage of near-infrared light from the photoelectric conversion unit 20IR for near-infrared light to the photoelectric conversion units 20B and 20R for visible light via the cut at the lower end of the element isolation units 31a, 31b, and 31e can be reduced by selectively making the depth D2 of the element isolation units 31c and 31d deeper than the depth D1 of the element isolation units 31a, 31b, and 31e. Meanwhile, since the depth D1 of the element isolation units 31a, 31b, and 31e is relatively shallow, the volume of the photodiodes in the photoelectric conversion units 20G, 20B, and 20R for visible light can be ensured. Therefore, it is possible to suppress color mixing caused by the photoelectric conversion unit 20IR for near-infrared light while securing the saturation charge amount of the photoelectric conversion units 20G, 20B, and 20R for visible light.

Further, in order to obtain the quantum-efficiency required as pixel characteristics for near-infrared light, it is favorable to thicken Si constituting the substrate 2. At this time, in the case where all the element isolation units 31a to 31e are also formed uniformly deep, there is a problem that the costs of the raw material gas of the insulating film 33 for embedding the groove portion or the like are increased. In contrast, in accordance with the solid-state imaging device according to the third embodiment of the present technology, it is possible to suppress an increase in the costs of the raw material gas by selectively deepening the depth D2 of the element isolation units 31c and 31d while keeping the depth D1 of the element isolation units 31a, 31b, and 31e.

Fourth Embodiment

Figure 11:
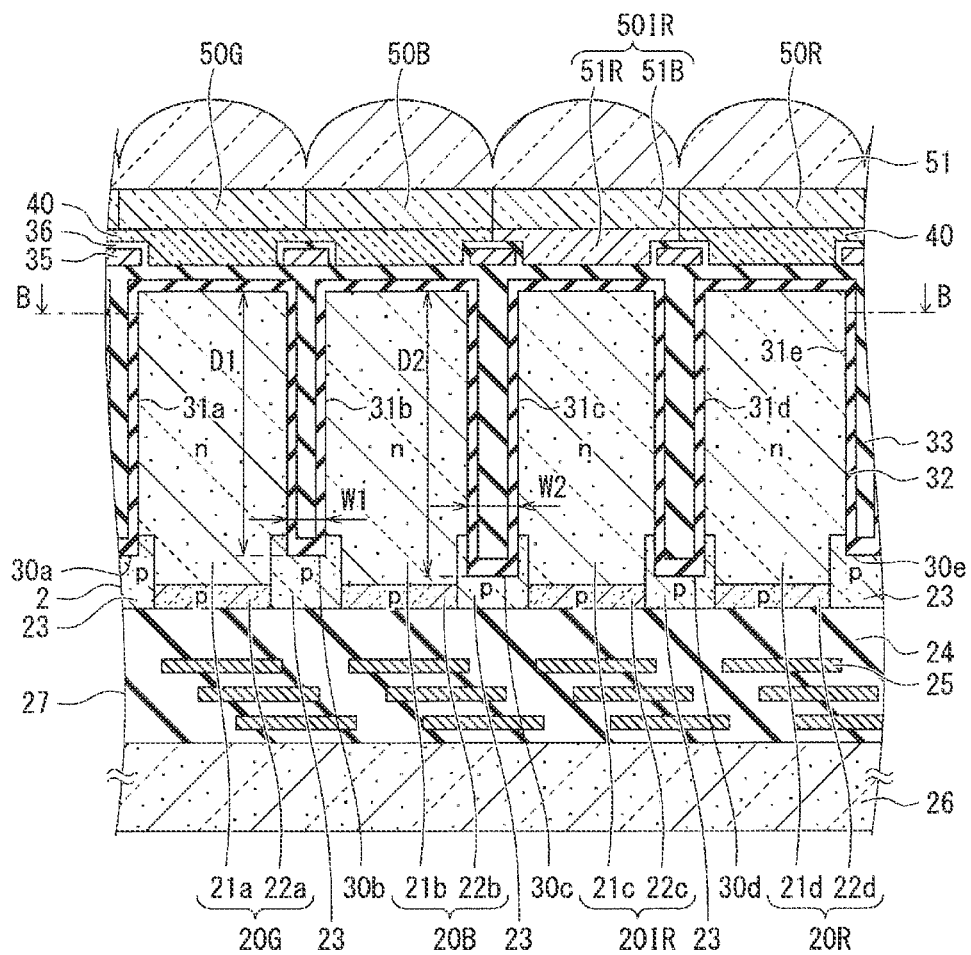
FIG. 11 is a cross-sectional view of a main part of a pixel region of a solid-state imaging device according to a fourth embodiment of the present technology.

As shown in FIG. 11, a solid-state imaging device according to a fourth embodiment of the present technology is common to the configuration according to the third embodiment of the present technology shown in FIG. 10 in that the element isolation units 31c and 31d for separating the photoelectric conversion units 20B and 20R for visible light and the photoelectric conversion unit 20IR for near-infrared light from each other do not have the light-shielding layer 34 and all the element isolation units 31a to 31e are configured by uniformly embedding the insulating films 32 and 33, and that the depth D2 of the element isolation units 31c and 31d is deeper than the depth D1 of the element isolation units 31a, 31b, and 31e for separating the photoelectric conversion units 20G, 20B, and 20R for visible light from each other. However, the solid-state imaging device is different from the configuration according to the third embodiment of the present technology shown in FIG. 10 in that the width W2 of the element isolation units 31c and 31d is wider than the width W1 of the element isolation units 31a, 31b, and 31e.

At the time of manufacturing the solid-state imaging device according to the fourth embodiment of the present technology, since the width W2 of the groove portions 30c and 30d is wider than the width W1 of the groove portions 30a, 30b, and 30e, the groove portions 30c and 30d are easier to be etched in the depth direction than the groove portion 30b. Therefore, the relatively shallow groove portions 30a, 30b, and 30e and the relatively deep groove portions 30c and 30d can be simultaneously formed in one mask pattern forming step and one etching step. Note that the mask pattern forming step and the etching step for forming the groove portions 30a, 30b, and 30e, and the mask pattern forming step and the etching step for forming the groove portions 30c and 30d may be separately performed.

In accordance with the solid-state imaging device according to the fourth embodiment of the present technology, even in the case where all the element isolation units 31a to 31e are configured by uniformly embedding the insulating films 32 and 33, leakage of near-infrared light from the photoelectric conversion unit 20IR for near-infrared light to the photoelectric conversion units 20B and 20R for visible light via the element isolation units 31a, 31b, and 31e can be reduced by selectively making the width W2 of the element isolation units 31c and 31d wider than the width W1 of the element isolation units 31a, 31b, and 31e.

Further, by selectively making the depth D2 of the element isolation units 31c and 31d deeper than the depth D1 of the element isolation units 31a, 31b, and 31e, leakage of near-infrared light from the photoelectric conversion unit 20IR for near-infrared light to the photoelectric conversion units 20B and 20R for visible light via the cut at the lower end of the element isolation units 31a, 31b, and 31e can be reduced. As a result, it is possible to suppress color mixing caused by the photoelectric conversion unit 20IR for near-infrared light while securing the saturation charge amount of the photoelectric conversion units 20G, 20B, and 20R for visible light.

Fifth Embodiment

Figure 12:
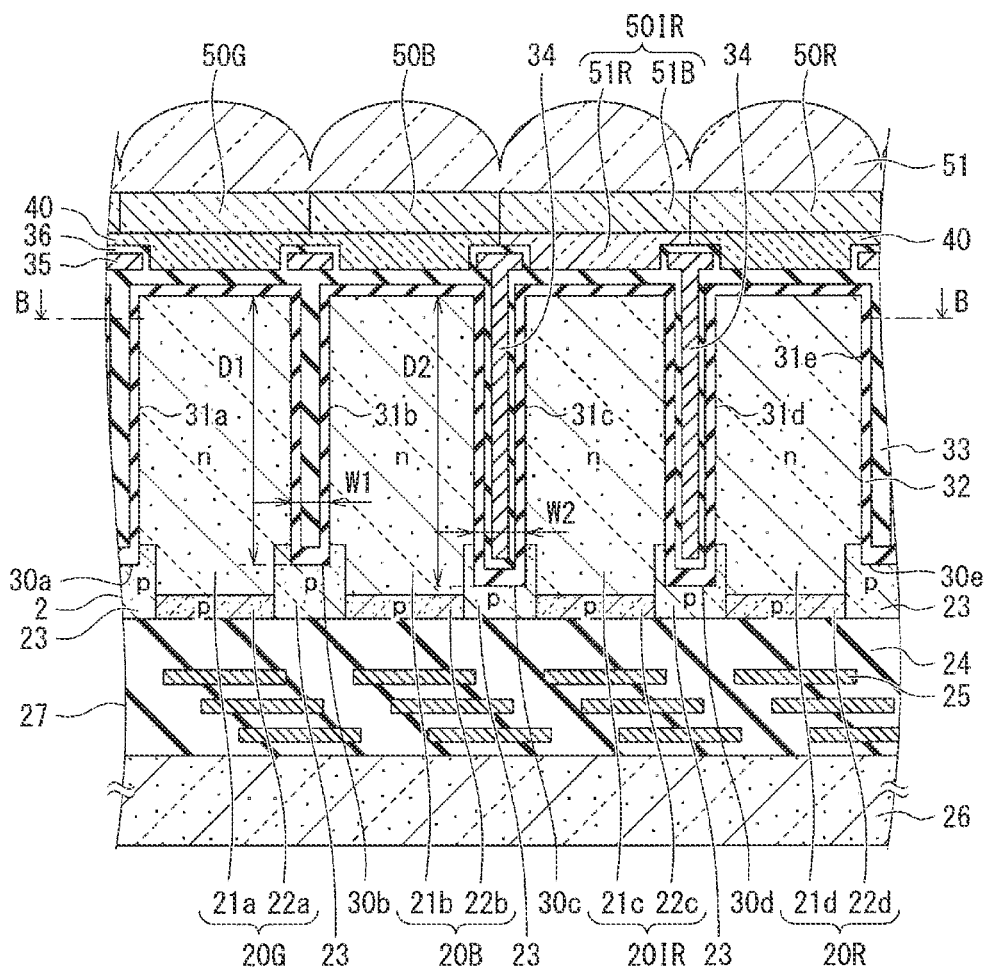
FIG. 12 is a cross-sectional view of a main part of a pixel region of a solid-state imaging device according to a fifth embodiment of the present technology.

As shown in FIG. 12, a solid-state imaging device according to a fifth embodiment of the present technology is common to the configuration according to the fourth embodiment of the present technology shown in FIG. 11 in that the width W2 of the element isolation units 31c and 31d for separating the photoelectric conversion units 20B and 20R for visible light and the photoelectric conversion unit 20IR for near-infrared light from each other is wider than the width W1 of the element isolation units 31a, 31b, and 31e for separating the photoelectric conversion units 20G, 20B and 20R for visible light from each other, and that the depth D2 of the element isolation units 31c and 31d is deeper than the depth D1 of the element isolation units 31a, 31b, and 31e. However, the solid-state imaging device is different from the configuration according to the fourth embodiment of the present technology shown in FIG. 11 in that the element isolation units 31c and 31d are configured by selectively embedding the insulating films 32 and 33 and the light-shielding layer 34.

At the time of manufacturing the solid-state imaging device according to the fifth embodiment of the present technology, since the width W2 of the groove portions 30c and 30d is wider than the width W1 of the groove portions 30a, 30b, and 30e, the groove portion 30c and 30d are easier to be etched in the depth direction than the groove portion 30b. Therefore, the relatively shallow groove portions 30a, 30b, and 30e and the relatively deep groove portions 30c and 30d can be simultaneously formed in one mask pattern forming step and one etching step. Note that the mask pattern forming step and the etching step for forming the groove portions 30a, 30b, and 30e, and the mask pattern forming step and the etching step for forming the groove portions 30c and 30d may be separately performed.

Further, when the insulating film 33 is deposited on the insulating film 32 by a CVD method or the like to embed the relatively thin groove portions 30a, 30b, and 30e with the insulating film 33 via the insulating film 32, the relatively thick groove portions 30c and 30d are not completely embedded by the insulating film 33. Then, a metal film serving as the light-shielding layer 34 and a metal film serving as the light-shielding film 35 are deposited on the insulating film 33 by a CVD method or the like, and the relatively thick groove portions 30c and 30d are embedded with the light-shielding layer 34 via the insulating films 32 and 33, whereby the element isolation units 31a to 31e can be formed.

In accordance with the solid-state imaging device according to the fifth embodiment of the present technology, since the light shielding capability against near-infrared light is enhanced by selectively embedding the insulating films 32 and 33 and the light-shielding layer 34 in the element isolation units 31c and 31d, leakage of near-infrared light from the photoelectric conversion unit 20IR for near-infrared light to the photoelectric conversion units 20B and 20R for visible light via the element isolation units 31a, 31b, and 31e can be reduced. Further, by selectively making the depth D2 of the element isolation units 31c and 31d deeper than the depth D1 of the element isolation units 31a, 31b, and 31e, leakage of near-infrared light from the photoelectric conversion unit 20IR for near-infrared light to the photoelectric conversion units 20B and 20R for visible light via the cut at the lower end of the element isolation units 31a, 31b, and 31e can be reduced. As a result, it is possible to suppress color mixing caused by the photoelectric conversion unit 20IR for near-infrared light while securing the saturation charge amount of the photoelectric conversion units 20G, 20B, and 20R for visible light.

Sixth Embodiment

Figure 13:
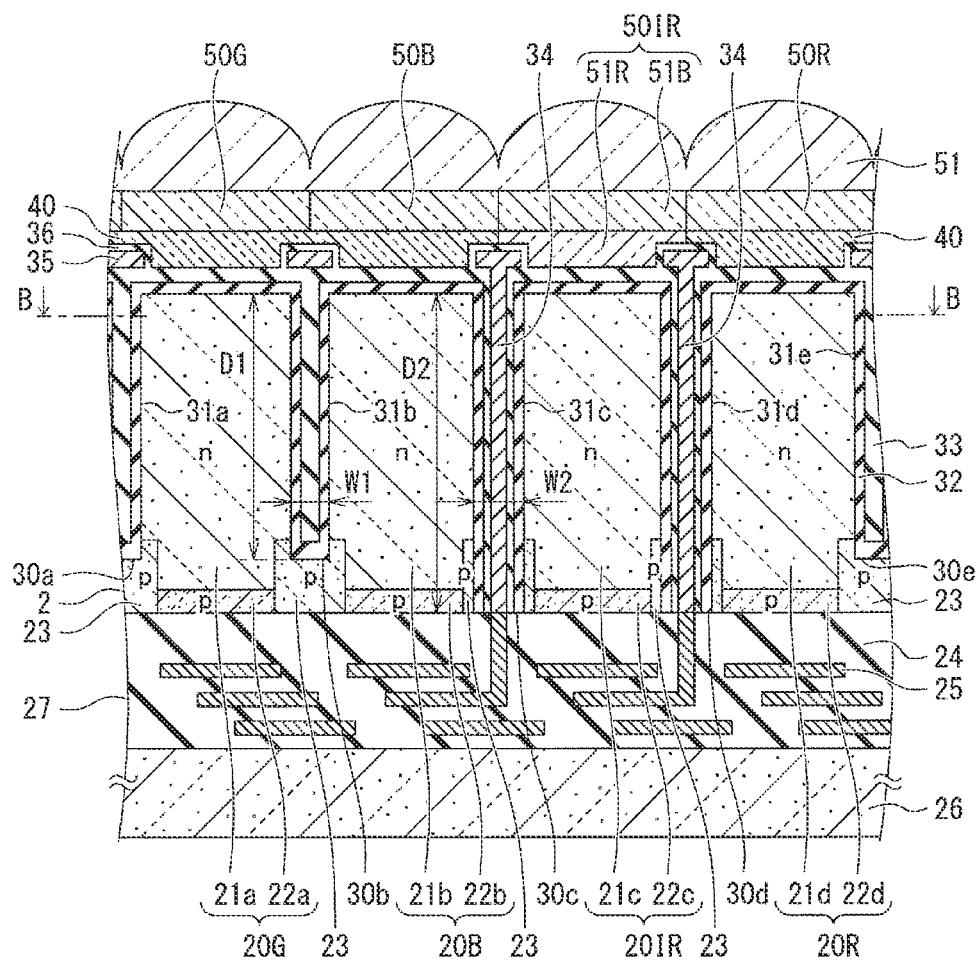
FIG. 13 is a cross-sectional view of a main part of a pixel region of a solid-state imaging device according to a sixth embodiment of the present technology.

As shown in FIG. 13, a solid-state imaging device according to a sixth embodiment of the present technology is common to the configuration according to the fifth embodiment of the present technology shown in FIG. 12 in that the element isolation units 31c and 31d for separating the photoelectric conversion units 20B and 20R for visible light and the photoelectric conversion unit 20IR for near-infrared light from each other are formed by selectively embedding the insulating films 32 and 33 and the light-shielding layer 34, that the width W2 of the element isolation units 31c and 31d is wider than the width W1 of the element isolation units 31a, 31b, and 31e for separating the photoelectric conversion units 20G, 20B, and 20R for visible light, and that the depth D2 of the element isolation units 31c and 31d is deeper than the depth D1 of the element isolation units 31a, 31b, and 31e. However, the solid-state imaging device is different from the configuration according to the fifth embodiment of the present technology shown in FIG. 12 in that the element isolation units 31c and 31d are formed deeper and penetrate through the substrate 2.

The light-shielding layer 34 can be formed of, for example, a metal material such as aluminum (Al), tungsten (W), copper (Cu), and chromium (Cr). The lower end of the light-shielding layer 34 embedded in the element isolation units 31c and 31d may be connected to the wiring 25, for example. Further, a ground potential or a negative potential may be supplied to the light-shielding layer 34 and the light-shielding film 35 via the wiring 25. As a result, an inversion layer can be easily formed on the side of the substrate 2 by the light-shielding layer 34 and the light-shielding film 35, and the effects of suppressing dark current can be enhanced.

At the time of manufacturing the solid-state imaging device according to the sixth embodiment of the present technology, since the width W2 of the groove portions 30c and 30d is wider than the width W1 of the groove portions 30a, 30b, and 30e, the groove portions 30c and 30d are easier to be etched in the depth direction than the groove portion 30b. Therefore, the relatively shallow groove portions 30a, 30b, and 30e and the relatively deep groove portions 30c and 30d can be simultaneously formed in one mask pattern forming step and one etching step. Note that the mask pattern forming step and the etching step for forming the groove portions 30a, 30b, and 30e, and the mask pattern forming step and the etching step for forming the groove portions 30c and 30d may be separately performed. Further, it only needs to remove, after depositing the insulating film 33 so as not to completely embed the groove portions 30c and 30d, the insulating films 32 and 33 on the bottom portion of the groove portions 30c and 30d by etch-back to expose the wiring 25 and embed the light-shielding layer 34.

In accordance with the solid-state imaging device according to the sixth embodiment of the present technology, since the light shielding capability against near-infrared light is enhanced by selectively embedding the insulating films 32 and 33 and the light-shielding layer 34 in the element isolation units 31c and 31d, leakage of near-infrared light from the photoelectric conversion unit 20IR for near-infrared light to the photoelectric conversion units 20B and 20R for visible light via the element isolation units 31a, 31b, and 31e can be reduced. Further, by selectively making the depth D2 of the element isolation units 31c and 31d deeper than the depth D1 of the element isolation units 31a, 31b, and 31e and further penetrating through the substrate 2, it is possible to suppress leakage of near-infrared light from the photoelectric conversion unit 20IR for near-infrared light to the photoelectric conversion units 20B and 20R for visible light via the cut at the lower end of the element isolation units 31a, 31b, and 31e. As a result, it is possible to suppress color mixing caused by the photoelectric conversion unit 20IR for near-infrared light while securing the saturation charge amount of the photoelectric conversion units 20G, 20B, and 20R for visible light.

Seventh Embodiment

Figure 14:
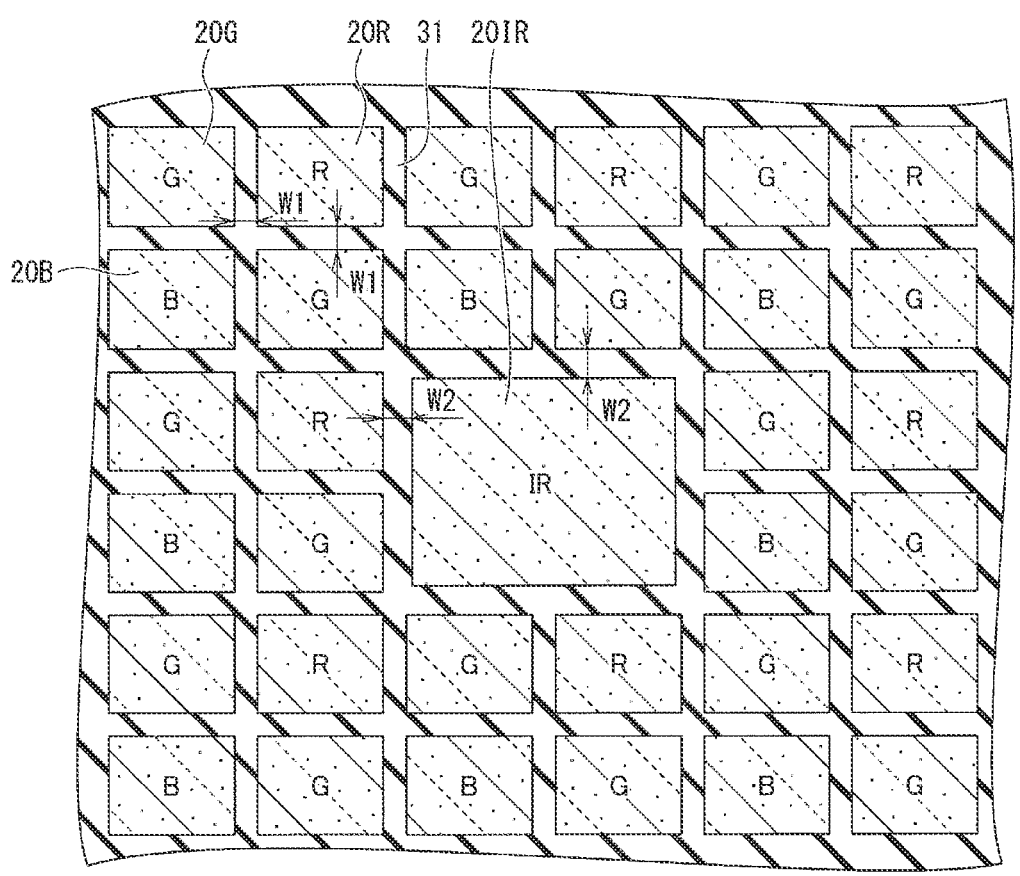
FIG. 14 is a plan view of a pixel region of a solid-state imaging device according to a seventh embodiment of the present technology.

As shown in FIG. 14, a solid-state imaging device according to a seventh embodiment of the present technology is different from the configuration according to the first embodiment of the present technology shown in FIG. 5 in that the photoelectric conversion units 20G, 20B, and 20R for visible light and the photoelectric conversion unit 20IR for near-infrared light are arranged not at an equal pitch but at different pitches on the plane pattern. The photoelectric conversion units 20G, 20B, and 20R for visible light are arranged at an equal pitch in the row and column directions. Meanwhile, the photoelectric conversion unit 20IR for near-infrared light is arranged at a ratio of one out of nine of the plurality of photoelectric conversion units 20G, 20B, and 20R.

The plurality of photoelectric conversion units 20G, 20B, 20IR, and 20R are element-separated in a grid shape by the element isolation unit 31. The opening area of the photoelectric conversion unit 20IR for near-infrared light partitioned by the element isolation unit 31 is larger than the opening area of the photoelectric conversion units 20G, 20B, and 20R for visible light partitioned by the element isolation unit 31. The width W2 of the element isolation unit 31 of the portion between the photoelectric conversion unit 20IR for near-infrared light and the photoelectric conversion units 20G, 20B, and 20R for visible light (in other words, the portion surrounding the photoelectric conversion unit 20IR for near-infrared light) is wider than the width W1 of the element isolation unit 31 of the portion between the photoelectric conversion units 20G, 20B, and 20R for visible light. The element isolation unit 31 may be configured by uniformly embedding an insulating film in all the portions. Alternatively, the portion surrounding the photoelectric conversion unit 20IR for near-infrared light may be configured by selectively increasing the number of members and embedding an insulating film and a light-shielding layer while forming the portion of the element isolation unit 31 between the photoelectric conversion units 20G, 20B, and 20R for visible light by embedding an insulating film.

In accordance with the solid-state imaging device according to the seventh embodiment of the present technology, in the case where the photoelectric conversion units 20G, 20B, and 20R for visible light and the photoelectric conversion unit 20IR for near-infrared light are arranged at different pitches, the opening area of the photoelectric conversion unit 20IR for near-infrared light is made larger than the opening area of the photoelectric conversion units 20G, 20B, and 20R for visible light. As a result, the width W2 of the element isolation unit 31 of the portion surrounding the photoelectric conversion unit 20IR for near-infrared light can be made wider than the width W1 of the element isolation unit 31 of the portion between the photoelectric conversion units 20G, 20B, and 20R for visible light. As a result, it is possible to suppress color mixing caused by the photoelectric conversion unit 20IR for near-infrared light while securing the saturation charge amount of the photoelectric conversion units 20G, 20B, and 20R for visible light.

Eighth Embodiment

Figure 15:
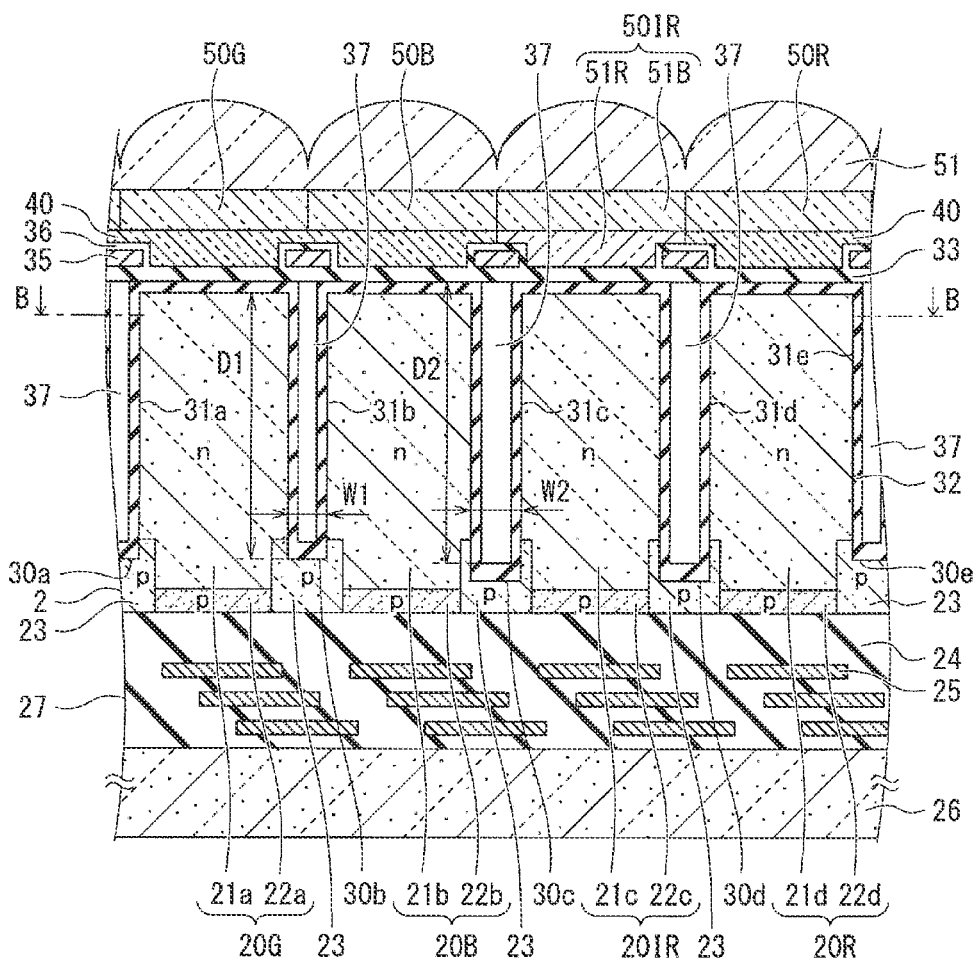
FIG. 15 is a cross-sectional view of a main part of a pixel region of a solid-state imaging device according to an eighth embodiment of the present technology.

As shown in FIG. 15, a solid-state imaging device according to an eighth embodiment of the present technology is different from the configuration according to the first embodiment of the present technology shown in FIG. 6 in that a gap 37 is provided in the element isolation units 31a to 31e instead of embedding the insulating film 33 in the element isolation units 31a to 31e. The insulating film 32 is provided in the groove portions 30a to 30e to form the gap 37 in the groove portions 30a to 30e via the insulating film 32.

FIG. 15 illustrates a case where the opening at the upper end of the groove portions 30a to 30e is not blocked by the insulating film 32 but is blocked by the insulating film 33. However, the opening at the upper end of the groove portions 30a to 30e may be blocked by the insulating film 32.

In accordance with the solid-state imaging device according to the eighth embodiment of the present technology, even in the case where the gap 37 is provided in the element isolation units 31a to 31e, leakage of near-infrared light from the photoelectric conversion unit 20IR for near-infrared light to the photoelectric conversion units 20B and 20R for visible light via the element isolation units 31a, 31b, and 31e can be reduced by selectively making the width W2 of the element isolation units 31c and 31d wider than the width W1 of the element isolation units 31a, 31b, and 31e.

Further, by selectively making the depth D2 of the element isolation units 31c and 31d deeper than the depth D1 of the element isolation units 31a, 31b, and 31e, leakage of near-infrared light from the photoelectric conversion unit 20IR for near-infrared light to the photoelectric conversion units 20B and 20R for visible light via the cut at the lower end of the element isolation units 31a, 31b, and 31e can be reduced. As a result, it is possible to suppress color mixing caused by the photoelectric conversion unit 20IR for near-infrared light while securing the saturation charge amount of the photoelectric conversion units 20G, 20B, and 20R for visible light.

Ninth Embodiment

Figure 16:
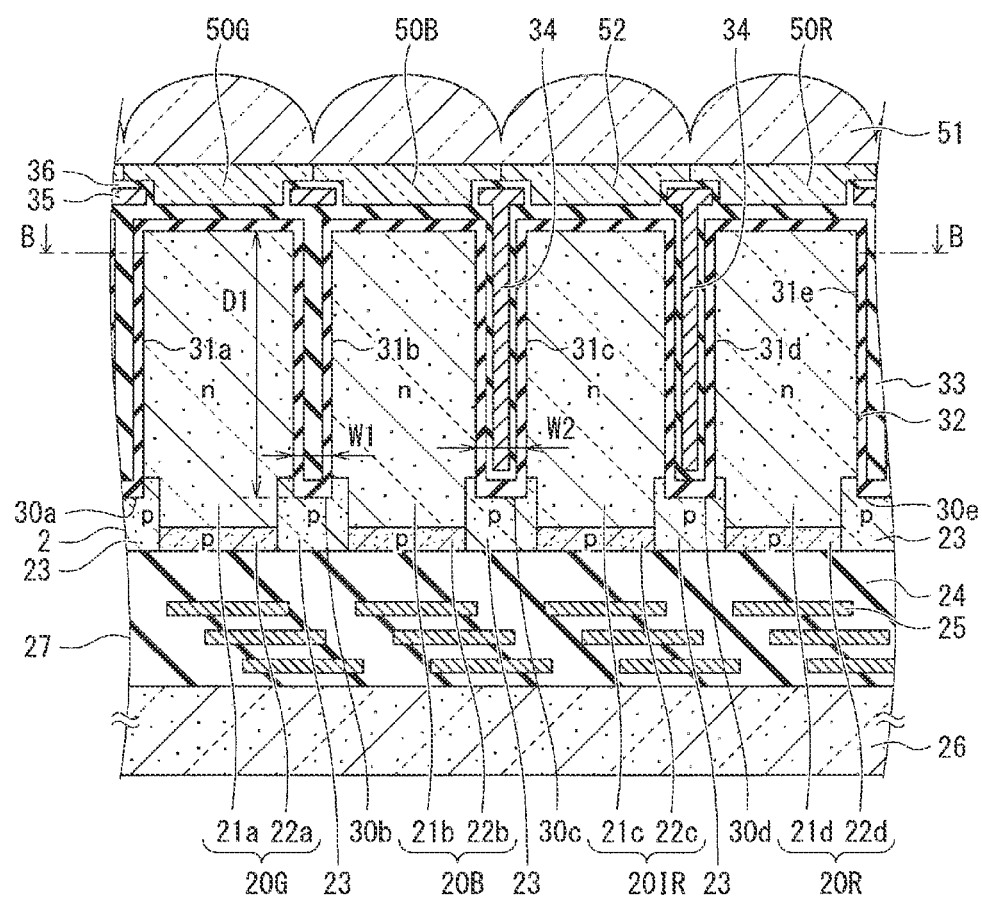
FIG. 16 is a cross-sectional view of a main part of a pixel region of a solid-state imaging device according to a ninth embodiment of the present technology.

As shown in FIG. 16, a solid-state imaging device according to a ninth embodiment of the present technology is common to the configuration according to the first embodiment of the present technology shown in FIG. 6 in the configurations of the element isolation units 31a to 31e. However, the solid-state imaging device is different from the configuration according to the first embodiment of the present technology shown in FIG. 6 in that the infrared absorbing filters 40 are not disposed on the back surface (light incident surface) side of the photoelectric conversion units 20G, 20B, and 20R for visible light.

The color filters 50G, 50B, and 50R for visible light are selectively disposed on the back surface (light incident surface) side of the photoelectric conversion units 20G, 20B, and 20R for visible light. The color filter 50G for green is disposed corresponding to the photoelectric conversion unit 20G for green, and has a transmission band of near-infrared light within a predetermined range of wavelengths in addition to a green transmission band. The color filter 50B for blue is disposed corresponding to the photoelectric conversion unit 20B for blue, and has a transmission band of near-infrared light within a predetermined range of wavelengths in addition to a blue transmission band. The color filter 50d for red is disposed corresponding to the photoelectric conversion unit 20R for red, and has a transmission band of near-infrared light within a predetermined range of wavelengths in addition to a red transmission band.

A color filter 52 for visible light is selectively disposed on the photoelectric conversion unit 20IR for near-infrared light. The color filter 52 for visible light is formed of a material having a transmission band of visible light (white light) and near-infrared light.

In the solid-state imaging device according to the ninth embodiment of the present technology, light transmitted through the dual pass filter 60 reaches the photoelectric conversion units 20G, 20B, and 20R for visible light and the photoelectric conversion unit 20IR for near-infrared light with near-infrared light components thereof not being absorbed. The signal processing unit 300 performs an operation of removing near-infrared light components from the respective lights, and extracting the intensities of the green light, the blue light, and the red light, on the basis of the signals from the photoelectric conversion units 20G, 20B, and 20R for visible light. Further, the signal processing unit 300 performs an operation of removing white-light components and extracting the intensity of near-infrared light, on the basis of the signal from the photoelectric conversion unit 20IR for near-infrared light.

In accordance with the solid-state imaging device according to the ninth embodiment of the present technology, since the light shielding capability against near-infrared light is enhanced by selectively embedding the insulating films 32 and 33 and the light-shielding layer 34 in the element isolation units 31c and 31d, leakage of near-infrared light from the photoelectric conversion unit 20IR for near-infrared light to the photoelectric conversion units 20B and 20R for visible light via the element isolation units 31a, 31b, and 31e can be reduced. Further, in accordance with the solid-state imaging device according to the ninth embodiment of the present technology, since the infrared absorbing filters 40 are not used, an inexpensive structure can be obtained.

Other Embodiments

As described above, while the present technology has been described by the first to ninth embodiments, the discussion and drawings that form a part of this disclosure are not to be understood as limiting the present technology. Various alternative embodiments, Examples, and operational technology will be apparent to those skilled in the art from this disclosure.

For example, in the solid-state imaging device 100 according to the first to ninth embodiments of the present technology, the back surface-illumination CMOS image sensor has been described as an example, but the present technology is applicable also to the back surface-illumination CCD-type image sensor. Further, as an electronic apparatus 1 including the solid-state imaging device 100 according to the first embodiment of the present technology, a digital still camera or a video camera, a camcorder, a monitoring camera, an in-vehicle camera, a camera for a smartphone, an interface camera for a game, a camera for biometric authentication, and the like can be exemplified. These devices are capable of simultaneously acquiring near-infrared image in addition to a normal visible light image.

Further, in the solid-state imaging device 100 according to the first to ninth embodiments of the present technology, the case where negative charges (electronics) are used as the signal charges has been described as an example, but the present technology is applicable also to the case where positive charges (holes) are used as the signal charges. In the case where holes are used as the signal charges, it only needs to configure the p-type region and the n-type region in the substrate 2 reversely, and use a material having positive fixed charges as the insulating film 32.

It should be noted that the present technology may take the following configurations.

(1) A solid-state imaging device, including:
  a substrate;
  a first photoelectric conversion unit formed on the substrate;
  a second photoelectric conversion unit that is formed on the substrate and adjacent to the first photoelectric conversion unit;
  a third photoelectric conversion unit that is formed on the substrate and adjacent to the second photoelectric conversion unit;
  infrared absorbing filters selectively disposed on a light incident surface side of the first photoelectric conversion unit and the second photoelectric conversion unit;
  a first color filter disposed on the light incident surface side of the first photoelectric conversion unit;
  a second color filter disposed on the light incident surface side of the second photoelectric conversion unit;
  a third color filter disposed on the light incident surface side of the third photoelectric conversion unit;
  a first element isolation unit disposed between the first photoelectric conversion unit and the second photoelectric conversion unit; and
  a second element isolation unit disposed between the second photoelectric conversion unit and the third photoelectric conversion unit, in which
  a cross-sectional area of the first element isolation unit along a direction in which the first photoelectric conversion unit and the second photoelectric conversion unit are aligned is larger than a cross-sectional area of the second element isolation unit along a direction in which the second photoelectric conversion unit and the third photoelectric conversion unit are aligned.

(2) The solid-state imaging device according to (1) above, in which
  a depth of the first element isolation unit is shallower than a depth of the first element isolation unit.

(3) The solid-state imaging device according to (1) or (2) above, in which
  a width of the first element isolation unit is narrower than a width of the first element isolation unit.

(4) The solid-state imaging device according to (3), in which
  the number of members constituting the first element isolation unit is smaller than the number of members constituting the second element isolation unit.

(5) The solid-state imaging device according to (4), in which
  the first element isolation unit includes a first insulating film embedded in a first groove portion formed in the substrate, and
  the second element isolation unit includes a second insulating film embedded in a second groove portion formed in the substrate and a light-shielding film embedded in the second groove portion via the second insulating film.

(6) The solid-state imaging device according to (1), in which
  the first element isolation unit includes a first insulating film embedded in a first groove portion formed in the substrate, and
  the second element isolation unit includes a second insulating film embedded in a second groove portion formed in the substrate.

(7) The solid-state imaging device according to any one of (3) to (5), in which
  the first photoelectric conversion unit, the second photoelectric conversion unit, and the third photoelectric conversion unit are arranged at an equal pitch, and
  each of opening areas of the first photoelectric conversion unit and the second photoelectric conversion unit is larger than an opening area of the third photoelectric conversion unit.

(8) The solid-state imaging device according to any one of (3) to (5), in which
  the first photoelectric conversion unit and the second photoelectric conversion unit are arranged at a pitch different from a pitch at which the third photoelectric conversion unit is arranged, and
  each of opening areas of the first photoelectric conversion unit and the second photoelectric conversion unit is smaller than an opening area of the third photoelectric conversion unit.

(9) The solid-state imaging device according to any one of (1) to (8), in which
  each of the first color filter and the second color filter has a transmission band of one of red, blue, and green, colors of the transmission bands being different from each other.

(10) The solid-state imaging device according to any one of (1) to (9), in which
  the third color filter is formed by stacking a color filter having a red transmission band and a color filter having a blue transmission band.

(11) The solid-state imaging device according to any one of (1) to (10), in which
  light enters the first photoelectric conversion unit, the second photoelectric conversion unit, and the third photoelectric conversion unit via a dual pass filter having a transmission band for visible light and near-infrared light.

(12) An electronic apparatus, including:
  a solid-state imaging device including
    a substrate,
    a first photoelectric conversion unit formed on the substrate,
    a second photoelectric conversion unit that is formed on the substrate and adjacent to the first photoelectric conversion unit,
    a third photoelectric conversion unit that is formed on the substrate and adjacent to the second photoelectric conversion unit,
    infrared absorbing filters selectively disposed on a light incident surface side of the first photoelectric conversion unit and the second photoelectric conversion unit,
    a first color filter disposed on the light incident surface side of the first photoelectric conversion unit,
    a second color filter disposed on the light incident surface side of the second photoelectric conversion unit,
    a third color filter disposed on the light incident surface side of the third photoelectric conversion unit, a first element isolation unit disposed between the first photoelectric conversion unit and the second photoelectric conversion unit, and
a second element isolation unit disposed between the second photoelectric conversion unit and the third photoelectric conversion unit;
an optical lens that forms an image of light from a subject onto an imaging surface of the solid-state imaging device; and
a signal processing circuit that performs signal processing on a signal output from the solid-state imaging device, in which
a cross-sectional area of the first element isolation unit along a direction in which the first photoelectric conversion unit and the second photoelectric conversion unit are aligned is larger than a cross-sectional area of the second element isolation unit along a direction in which the second photoelectric conversion unit and the third photoelectric conversion unit are aligned.

REFERENCE SIGNS LIST 1 electronic apparatus, 2 substrate, 3 pixel, 4 pixel region, 5 vertical drive circuit, 6 column signal processing circuit, 7 horizontal drive circuit, 8 output circuit, 9 control circuit, 10 pixel drive wiring, 11 vertical signal line, 12 horizontal signal line, 20G,20B,20IR,20R photoelectric conversion unit, 21a,21b,21c,21d n-type semiconductor region, 22a,22b,22c,22d p-type semiconductor region, 31a-31e element isolation unit, 23 a p-well region, 24 wiring layer, 25 wiring, 26 support substrate, 27 interlayer insulating film, 30a,30b,30c,30d,30e groove portion, 31,31a,31b,31c,31d element isolation unit, 32,33 insulating film, 34 light-shielding layer, 35 light-shielding film, 36 flattening film, 37 gap, 40 infrared absorbing filter, 50G,50B,50IR,50R,51B,51R,52 color filter, 51 on-chip lens, 60 dual pass filter, 100 solid-state imaging device, 200 optical unit, 300 signal processing unit, 300 signal processing circuit, 400 near-infrared light source unit, 500 subject

What is claimed is:

1. A solid-state imaging device, comprising:
a substrate;
a first photoelectric conversion unit formed on the substrate;
a second photoelectric conversion unit that is formed on the substrate and adjacent to the first photoelectric conversion unit;
a third photoelectric conversion unit that is formed on the substrate and adjacent to the second photoelectric conversion unit;
infrared absorbing filters selectively disposed on a light incident surface side of the first photoelectric conversion unit and the second photoelectric conversion unit;
a first color filter disposed on the light incident surface side of the first photoelectric conversion unit;
a second color filter disposed on the light incident surface side of the second photoelectric conversion unit;
a third color filter disposed on the light incident surface side of the third photoelectric conversion unit;
a first element isolation unit disposed between the first photoelectric conversion unit and the second photoelectric conversion unit; and
a second element isolation unit disposed between the second photoelectric conversion unit and the third photoelectric conversion unit, wherein
a cross-sectional area of the first element isolation unit along a direction in which the first photoelectric conversion unit and the second photoelectric conversion unit are aligned is smaller than a cross-sectional area of the second element isolation unit along a direction in which the second photoelectric conversion unit and the third photoelectric conversion unit are aligned.

2. The solid-state imaging device according to claim 1, wherein
a depth of the first element isolation unit is shallower than a depth of the second element isolation unit.

3. The solid-state imaging device according to claim 1, wherein
a width of the first element isolation unit is narrower than a width of the second element isolation unit.

4. The solid-state imaging device according to claim 3, wherein a number of members constituting the first element isolation unit is smaller than a number of members constituting the second element isolation unit.

5. The solid-state imaging device according to claim 4, wherein
the first element isolation unit includes a first insulating film embedded in a first groove portion formed in the substrate, and
the second element isolation unit includes a second insulating film embedded in a second groove portion formed in the substrate and a light-shielding film embedded in the second groove portion via the second insulating film.

6. The solid-state imaging device according to claim 1, wherein
the first element isolation unit includes a first insulating film embedded in a first groove portion formed in the substrate, and
the second element isolation unit includes a second insulating film embedded in a second groove portion formed in the substrate.

7. The solid-state imaging device according to claim 3, wherein
the first photoelectric conversion unit, the second photoelectric conversion unit, and the third photoelectric conversion unit are arranged at an equal pitch, and
each of opening areas of the first photoelectric conversion unit and the second photoelectric conversion unit is larger than an opening area of the third photoelectric conversion unit.

8. The solid-state imaging device according to claim 3, wherein
the first photoelectric conversion unit and the second photoelectric conversion unit are arranged at a pitch different from a pitch at which the third photoelectric conversion unit is arranged, and
each of opening areas of the first photoelectric conversion unit and the second photoelectric conversion unit is smaller than an opening area of the third photoelectric conversion unit.

9. The solid-state imaging device according to claim 1, wherein
each of the first color filter and the second color filter has a transmission band of one of red, blue, and green, colors of the transmission bands being different from each other.

10. The solid-state imaging device according to claim 1, wherein
the third color filter is formed by stacking a color filter having a red transmission band and a color filter having a blue transmission band.

11. The solid-state imaging device according to claim 1, wherein
light enters the first photoelectric conversion unit, the second photoelectric conversion unit, and the third photoelectric conversion unit via a dual pass filter having a transmission band for visible light and near-infrared light.

12. An electronic apparatus, comprising:
a solid-state imaging device including
  a substrate,
  a first photoelectric conversion unit formed on the substrate,
  a second photoelectric conversion unit that is formed on the substrate and adjacent to the first photoelectric conversion unit,
  a third photoelectric conversion unit that is formed on the substrate and adjacent to the second photoelectric conversion unit,
  infrared absorbing filters selectively disposed on a light incident surface side of the first photoelectric conversion unit and the second photoelectric conversion unit,
  a first color filter disposed on the light incident surface side of the first photoelectric conversion unit,
  a second color filter disposed on the light incident surface side of the second photoelectric conversion unit,
  a third color filter disposed on the light incident surface side of the third photoelectric conversion unit,
  a first element isolation unit disposed between the first photoelectric conversion unit and the second photoelectric conversion unit, and
  a second element isolation unit disposed between the second photoelectric conversion unit and the third photoelectric conversion unit;
an optical lens that forms an image of light from a subject onto an imaging surface of the solid-state imaging device; and
a signal processing circuit that performs signal processing on a signal output from the solid-state imaging device, wherein
a cross-sectional area of the first element isolation unit along a direction in which the first photoelectric conversion unit and the second photoelectric conversion unit are aligned is smaller than a cross-sectional area of the second element isolation unit along a direction in which the second photoelectric conversion unit and the third photoelectric conversion unit are aligned.

* * * * *